United States Patent
Shiota

[11] Patent Number: 5,591,661
[45] Date of Patent: *Jan. 7, 1997

[54] METHOD FOR FABRICATING DEVICES FOR ELECTROSTATIC DISCHARGE PROTECTION AND VOLTAGE REFERENCES, AND THE RESULTING STRUCTURES

[76] Inventor: Philip Shiota, 14270 Old Wood Rd., Saratoga, Calif. 95070

[*] Notice: The term of this patent shall not extend beyond the expiration date of Pat. No. 5,272,097.

[21] Appl. No.: 366,048

[22] Filed: Dec. 29, 1994

Related U.S. Application Data

[60] Continuation-in-part of Ser. No. 93,074, Aug. 20, 1993, Pat. No. 5,426,322, which is a division of Ser. No. 864,933, Apr. 7, 1992, Pat. No. 5,272,097.

[51] Int. Cl.$^6$ .............................. H01L 21/70; H01L 27/00
[52] U.S. Cl. .................. 437/56; 437/15; 437/60; 437/904
[58] Field of Search .................. 437/34, 15, 60, 437/904, 56

[56] References Cited

U.S. PATENT DOCUMENTS

| | | | |
|---|---|---|---|
| 3,667,009 | 5/1972 | Rugg | 437/34 |
| 3,787,717 | 1/1974 | Fischer et al. | 307/303 |
| 4,081,292 | 3/1978 | Aoki et al. | 437/904 |
| 4,312,680 | 1/1982 | Hsu | 437/21 |
| 4,357,178 | 11/1982 | Bergeron et al. | 437/904 |
| 4,366,522 | 12/1982 | Baker | 361/91 |
| 4,400,711 | 8/1983 | Avery | 257/133 |
| 4,412,237 | 10/1983 | Matsumura | 257/369 |
| 4,677,735 | 7/1987 | Malhi | 437/34 |
| 4,712,152 | 12/1987 | Iio | 361/56 |
| 4,763,184 | 8/1988 | Krieger et al. | 29/78 |
| 4,786,955 | 11/1988 | Plus et al. | 257/351 |
| 4,806,999 | 2/1989 | Strauss | 257/357 |
| 4,875,130 | 10/1989 | Huard | 361/56 |
| 4,916,085 | 4/1990 | Frisina | 437/44 |
| 4,937,645 | 6/1990 | Ootsuka et al. | 257/357 |
| 5,065,212 | 11/1991 | Ohata et al. | 437/6 |
| 5,081,514 | 1/1992 | Ueoka | 257/355 |
| 5,144,518 | 9/1992 | Miyazaki | 257/355 |
| 5,182,220 | 1/1993 | Ker et al. | 437/34 |
| 5,182,621 | 1/1993 | Hinooka | 257/357 |
| 5,254,866 | 10/1993 | Ogoh | 257/369 |
| 5,272,097 | 12/1993 | Shiota | 437/34 |

FOREIGN PATENT DOCUMENTS

| | | |
|---|---|---|
| 0042581 | 12/1981 | European Pat. Off. . |
| 0255125 | 2/1988 | European Pat. Off. . |
| 61-22934 | 10/1986 | Japan . |
| 1-214055 | 4/1989 | Japan . |
| 3093265 | 4/1991 | Japan . |
| 2090701 | 7/1982 | United Kingdom . |
| 2234126 | 1/1991 | United Kingdom . |

OTHER PUBLICATIONS

Internal Chip ESD Phenomena Beyond the Protection Circuit in *IEEE/IRPS* 1988 pp. 19–25.
New ESD Protection Concept for VLSI CMOS Circuits Avoiding Circuit Stress 1991 EOS ESD Symposium Proceedings, pp. 74–82.

*Primary Examiner*—Jey Tsai
*Attorney, Agent, or Firm*—Steven F. Caserza; Flehr, Hohbach, Test, Albritton & Herbert

[57] ABSTRACT

A novel process is taught for forming diodes in a process which simultaneously forms MOS or CMOS devices. These diodes have relatively low breakdown voltage, making them suitable for ESD protection devices or as voltage reference diodes. In alternative embodiments, novel low breakdown voltage devices are fabricated in a similar fashion as MOS devices but with doping levels such that the inherent bipolar device has a low breakdown voltage characteristic. In alternative embodiments, novel vertical bipolar transistors are taught, as are SCR devices, having low breakdown voltage characteristics. In one embodiment of this invention, a low breakdown voltage device is integrated directly with a standard MOS transistor, allowing the low breakdown voltage device to trigger the turn on of the standard MOS device, thereby providing large current capacity controlled by the low breakdown voltage device.

38 Claims, 32 Drawing Sheets

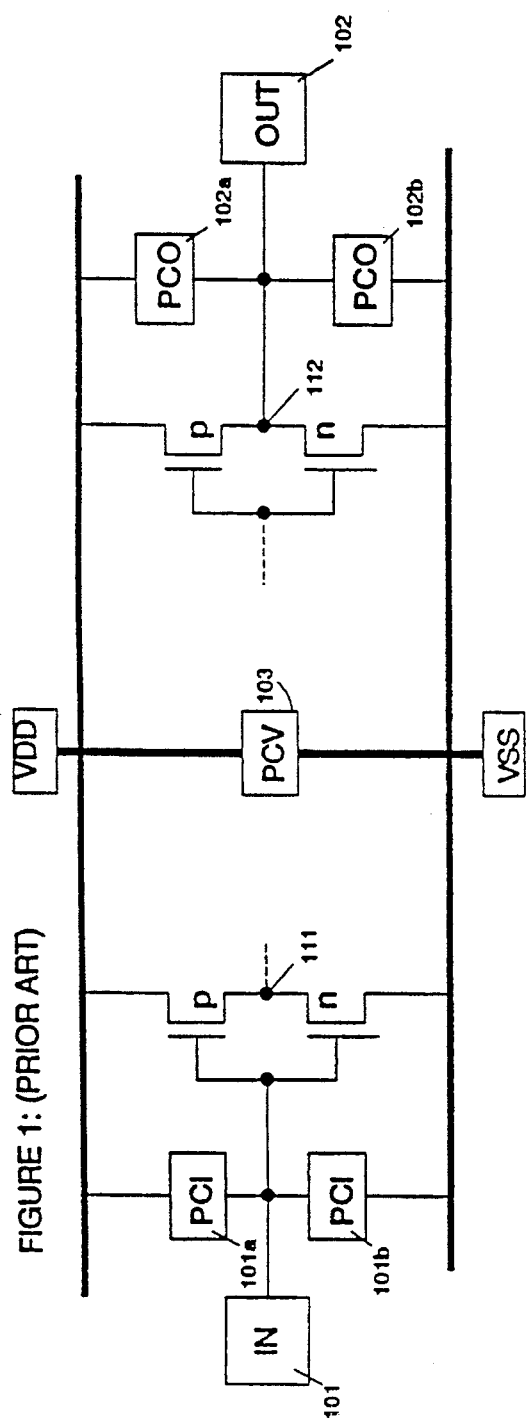
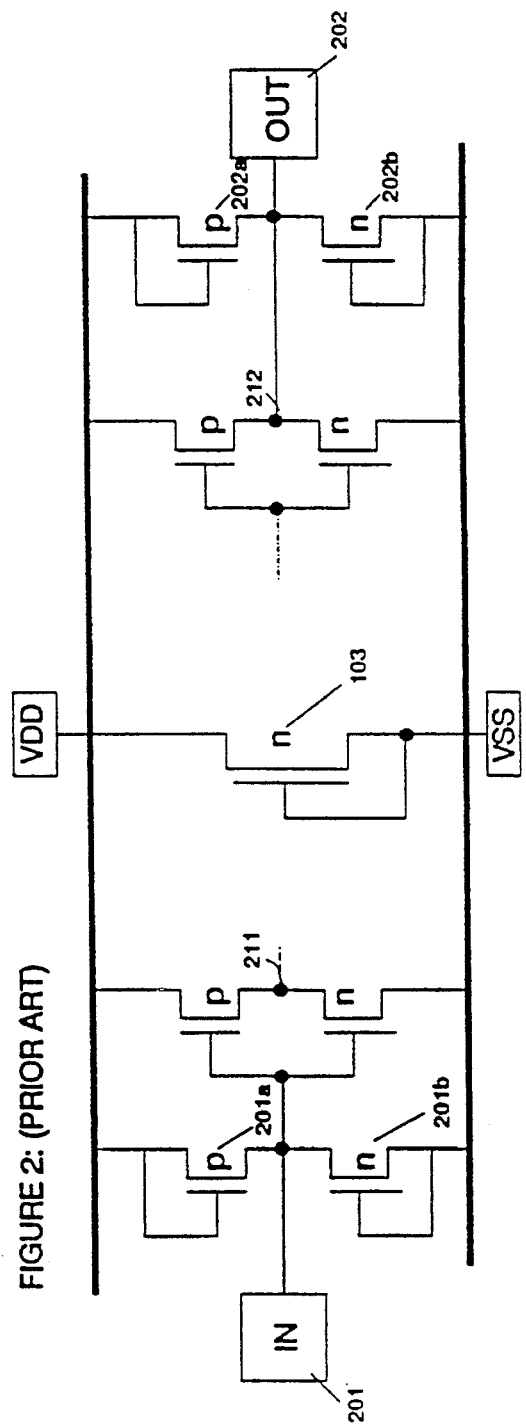

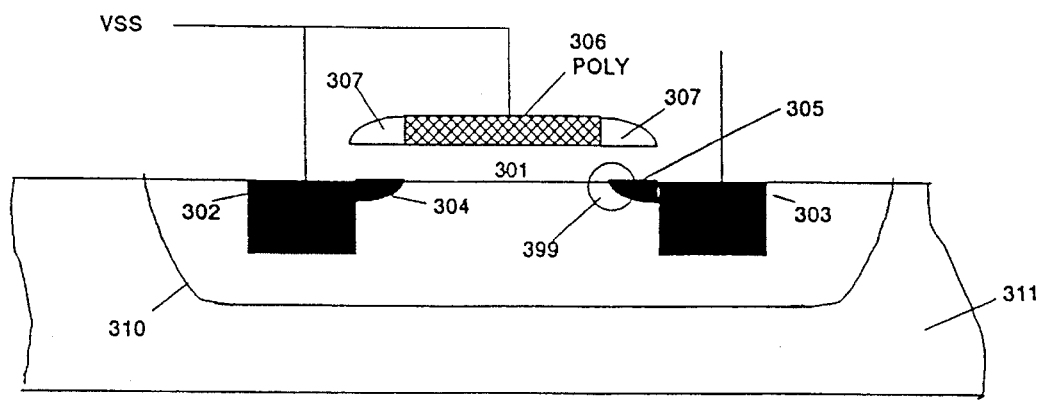
FIGURE 3: (PRIOR ART)
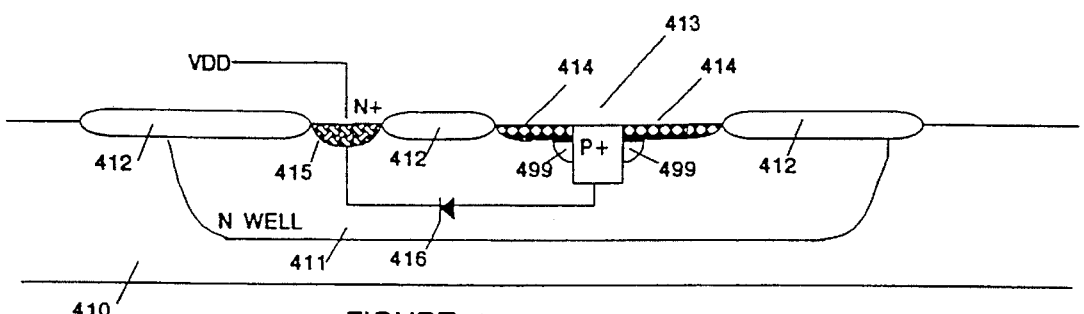
FIGURE 4:
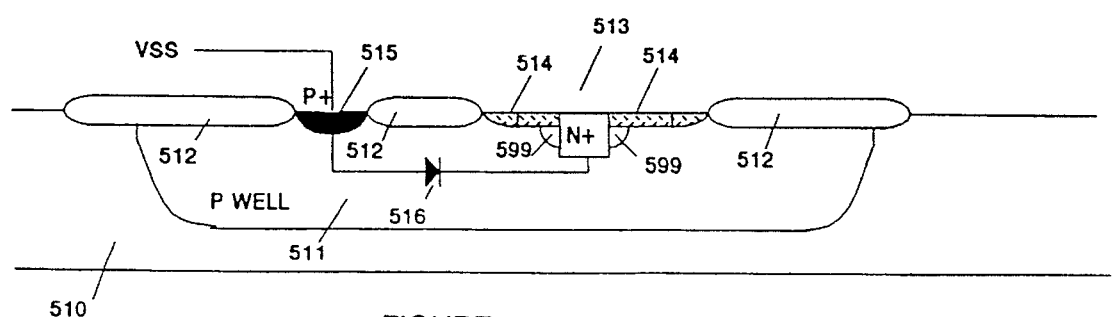
FIGURE 5:

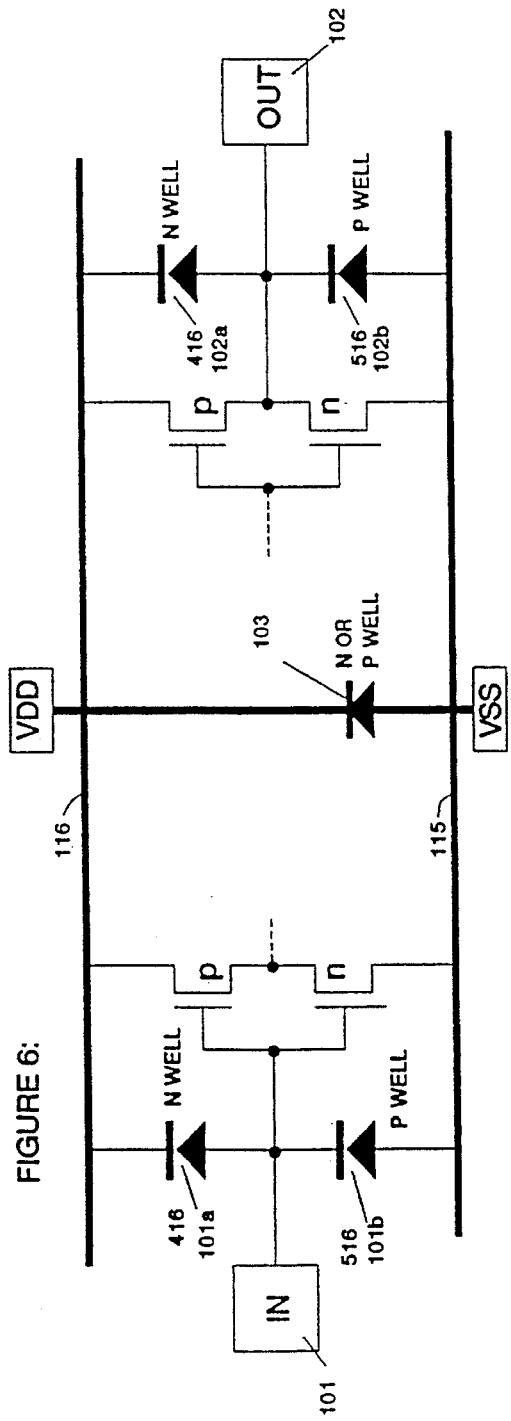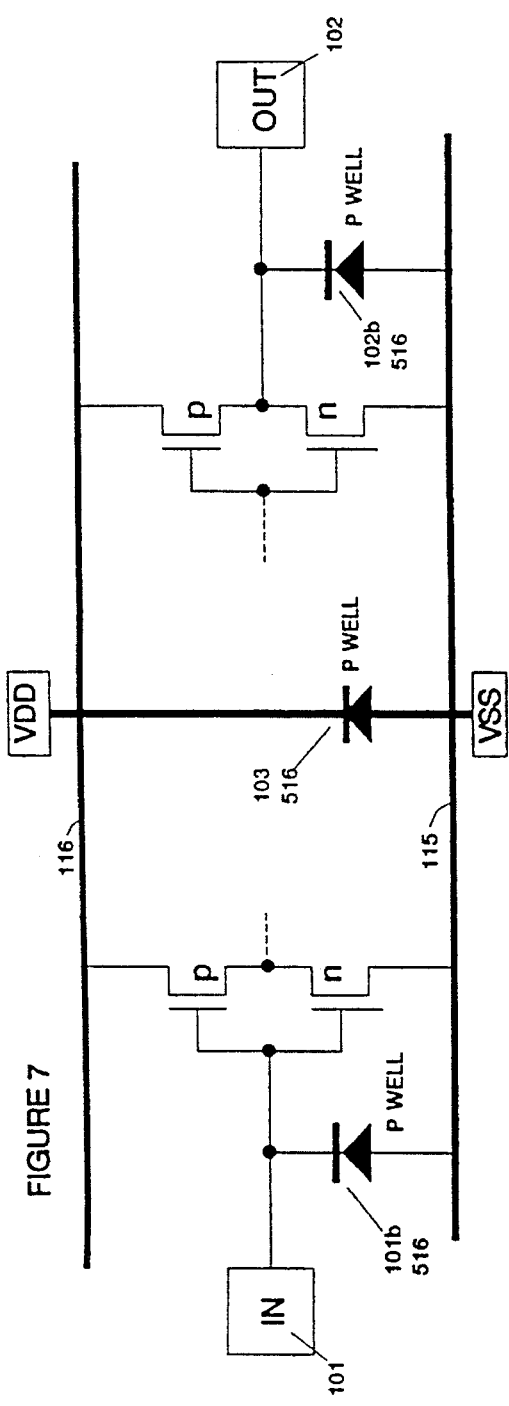

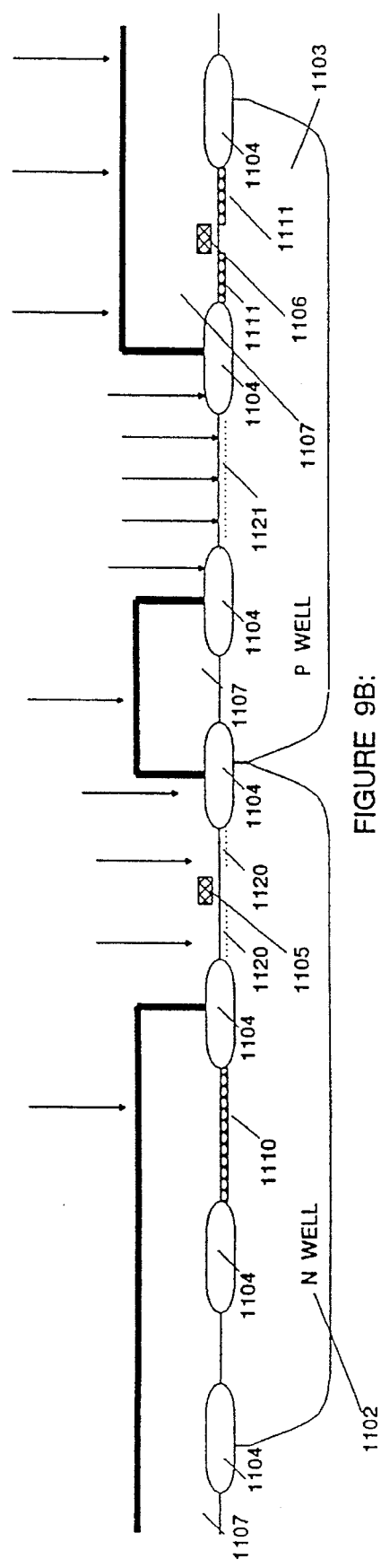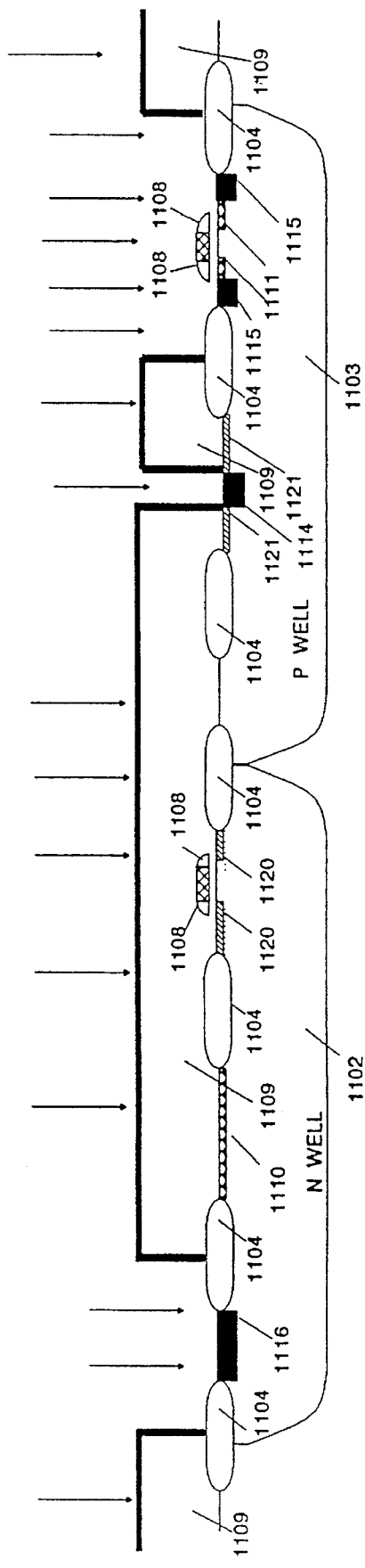

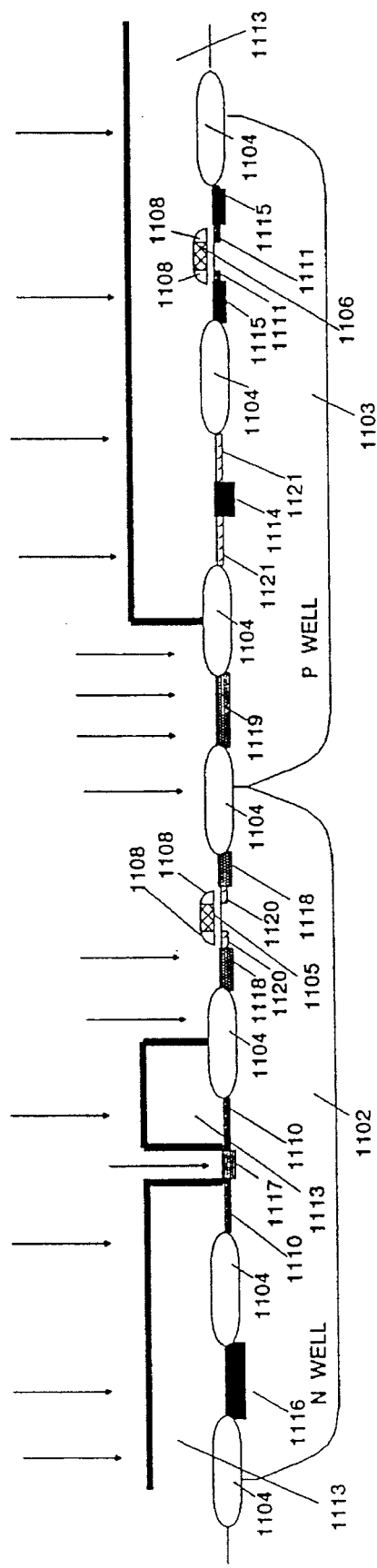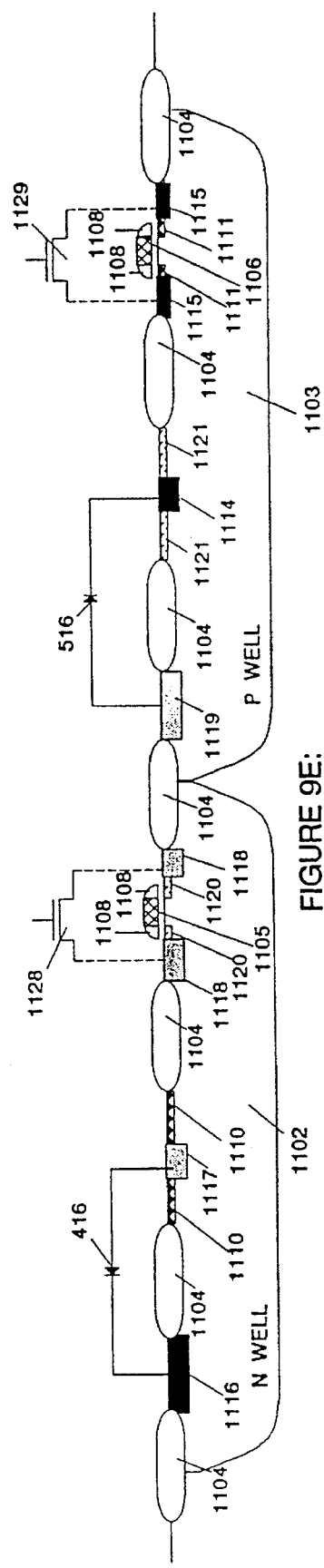

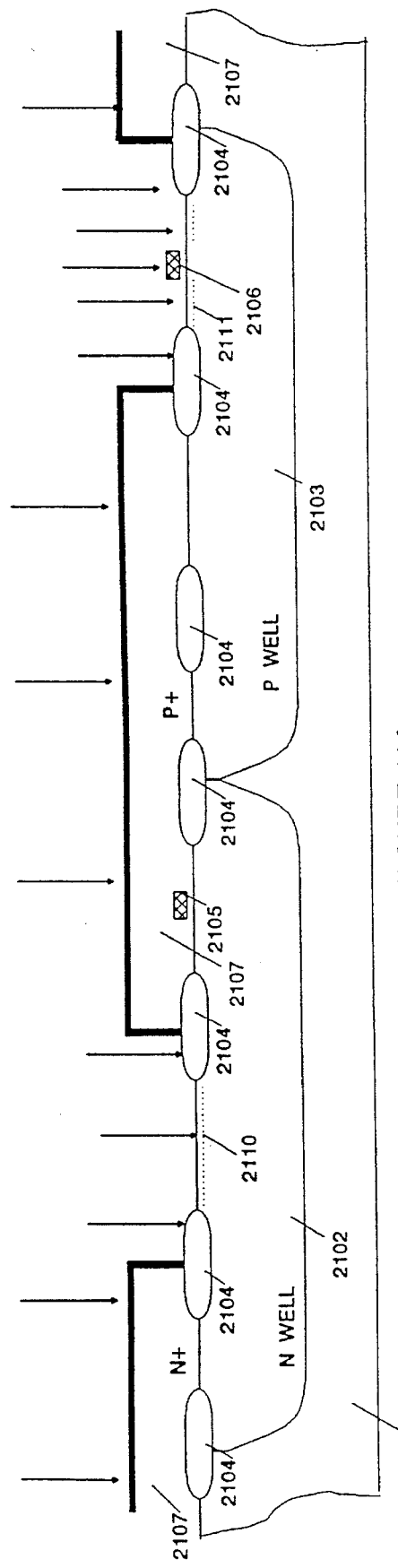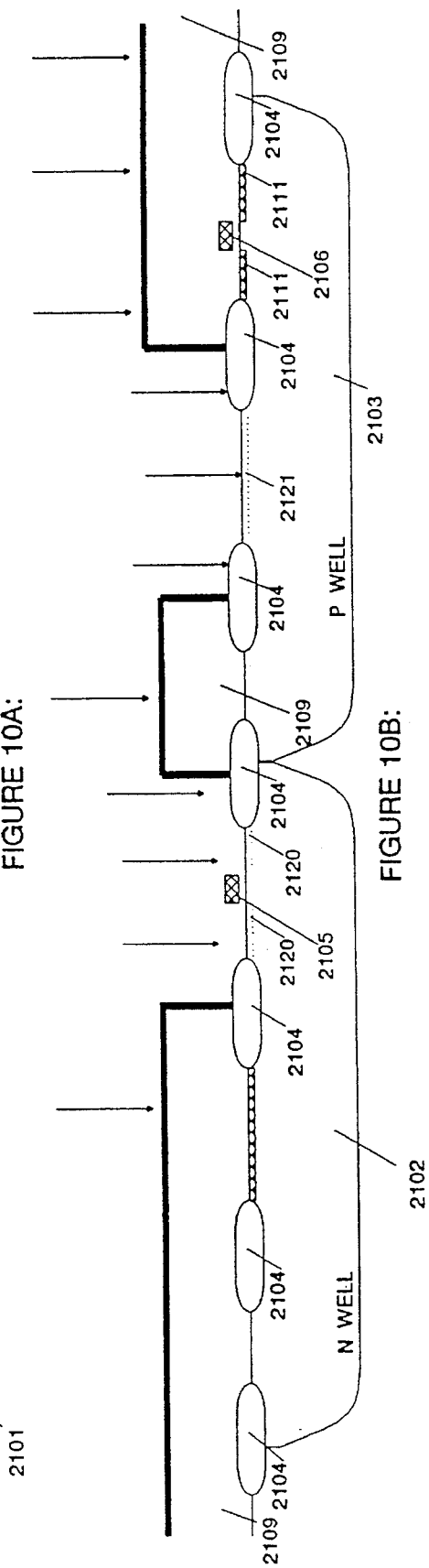

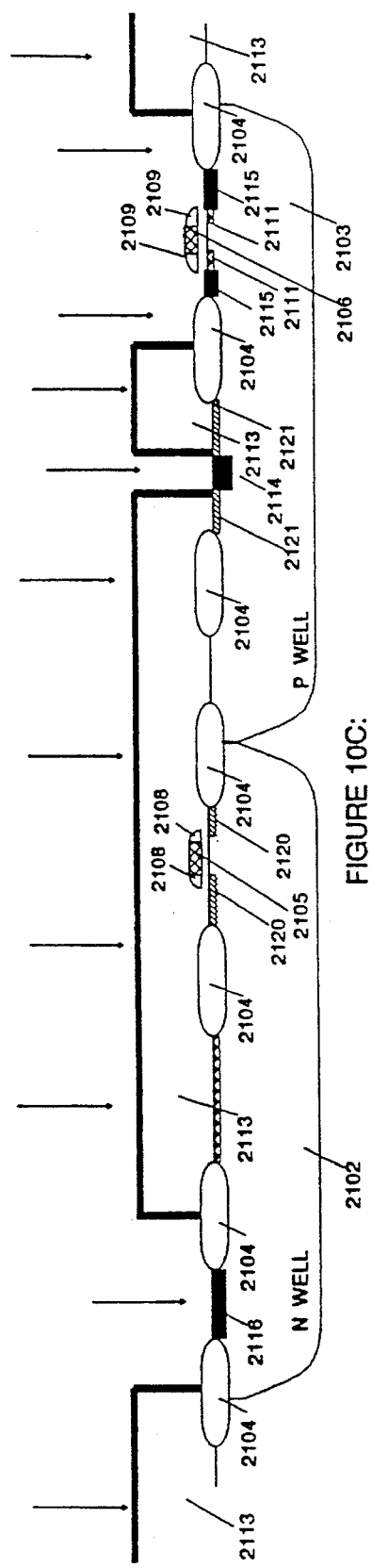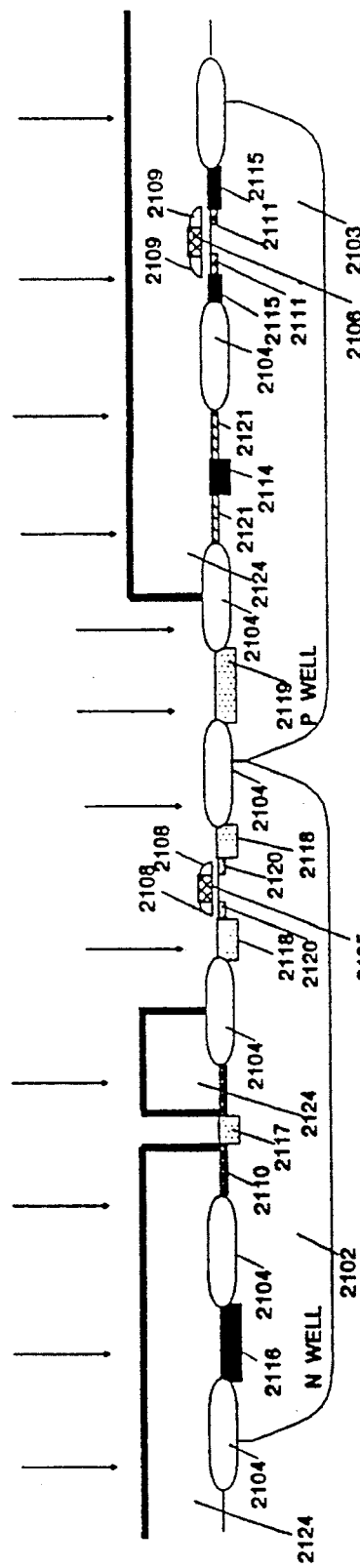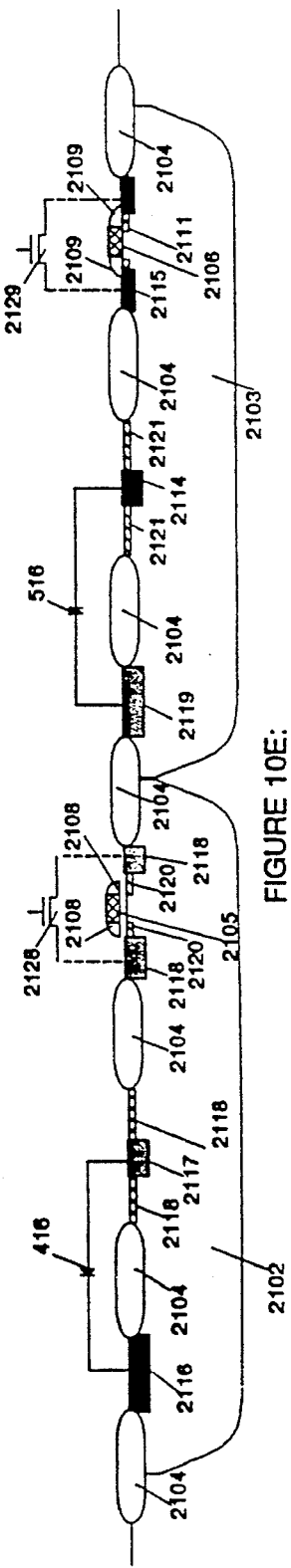

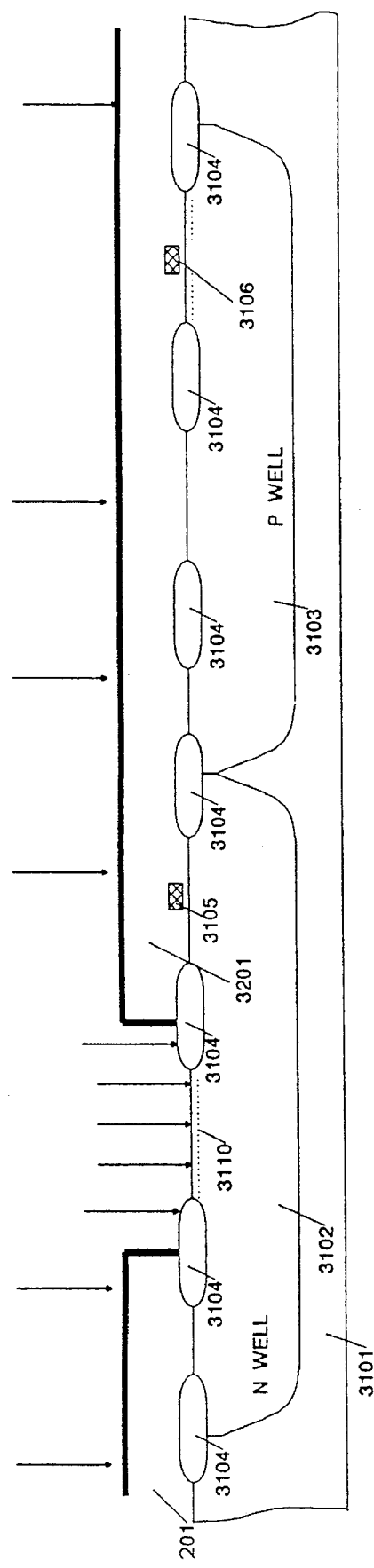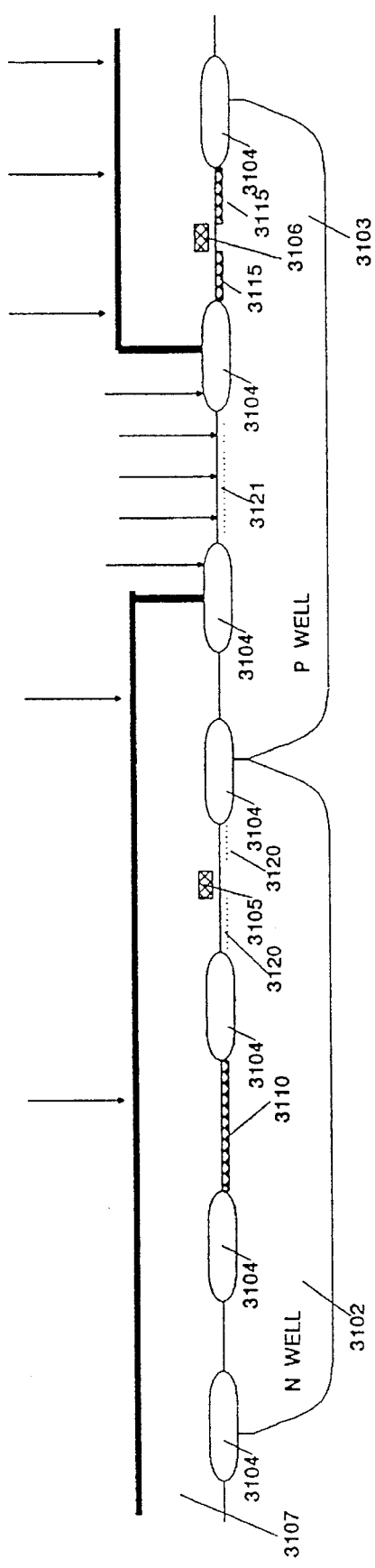
FIGURE 11A:
FIGURE 11B:

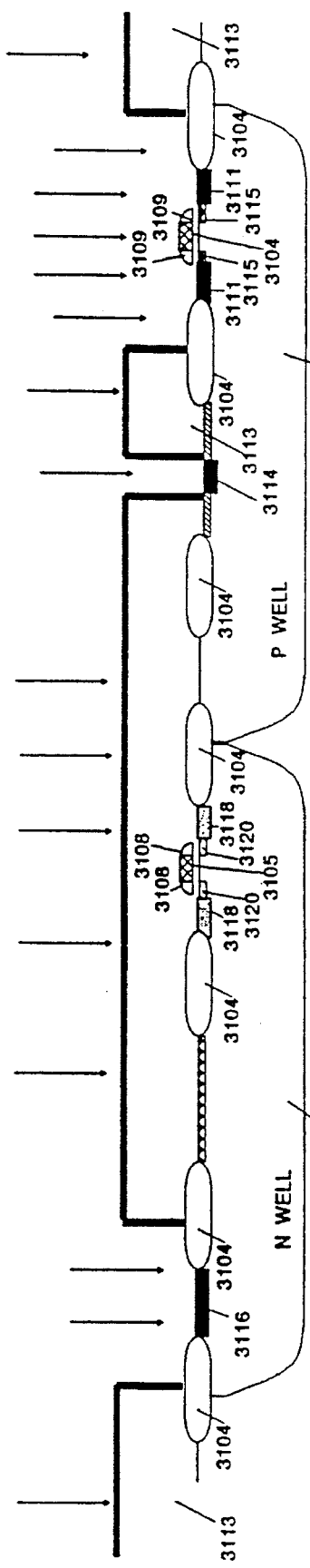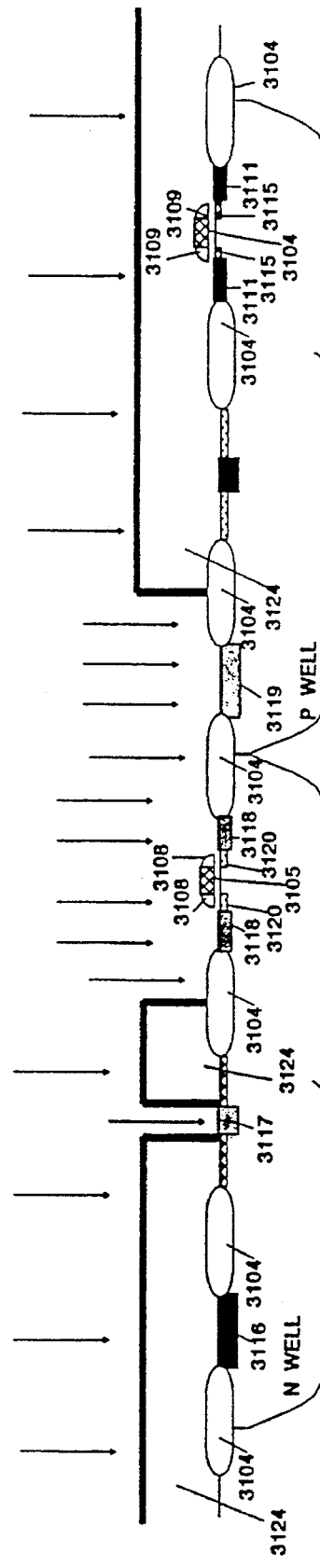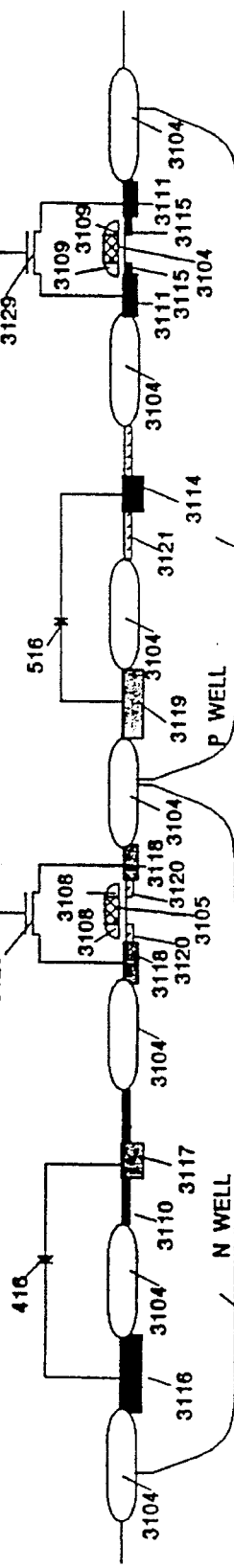

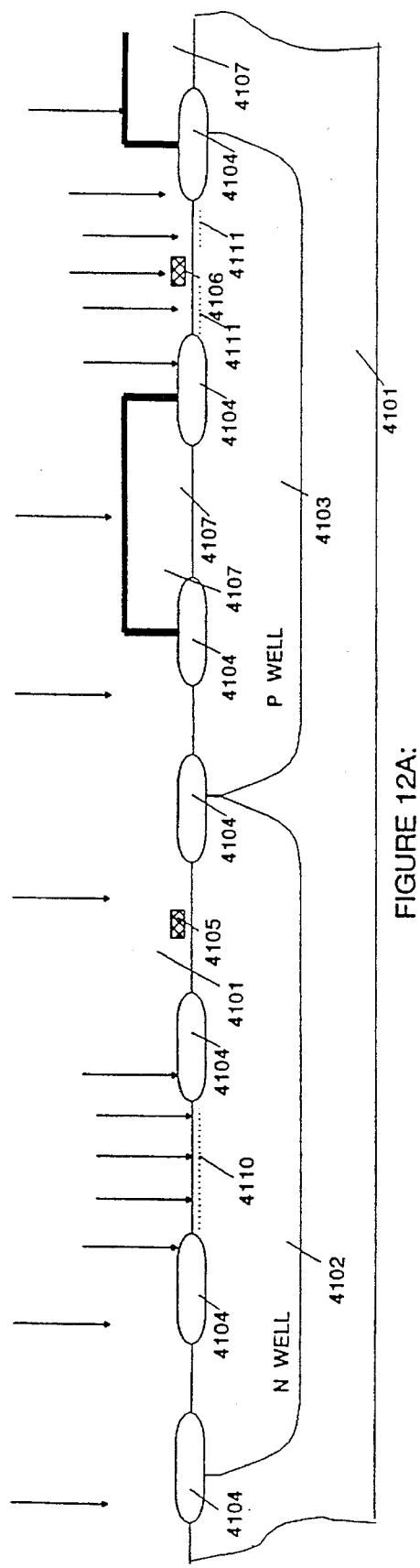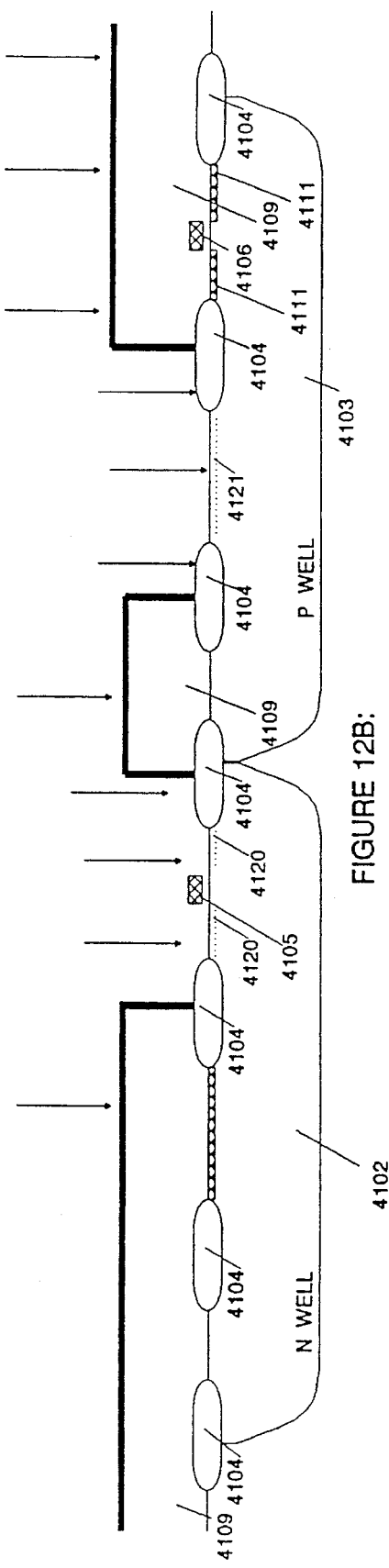

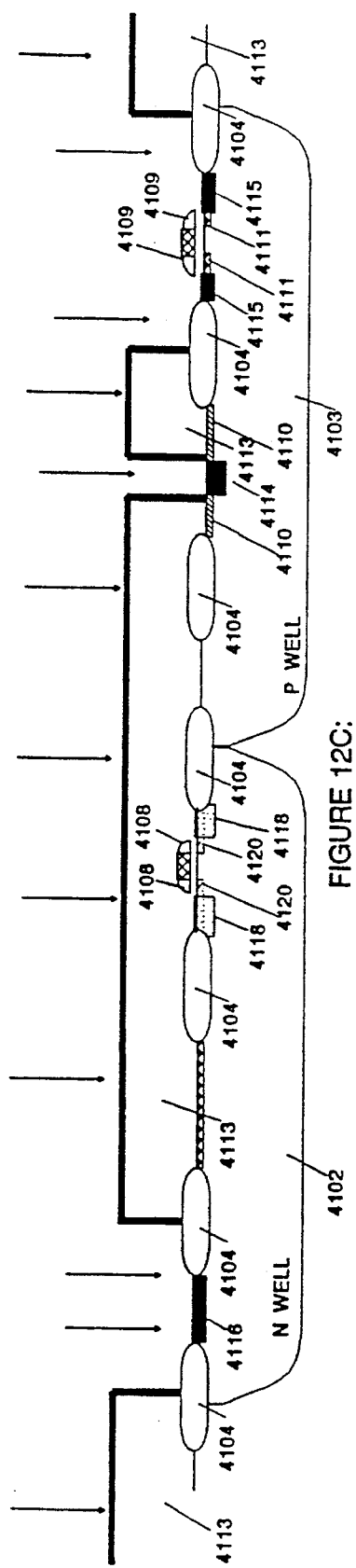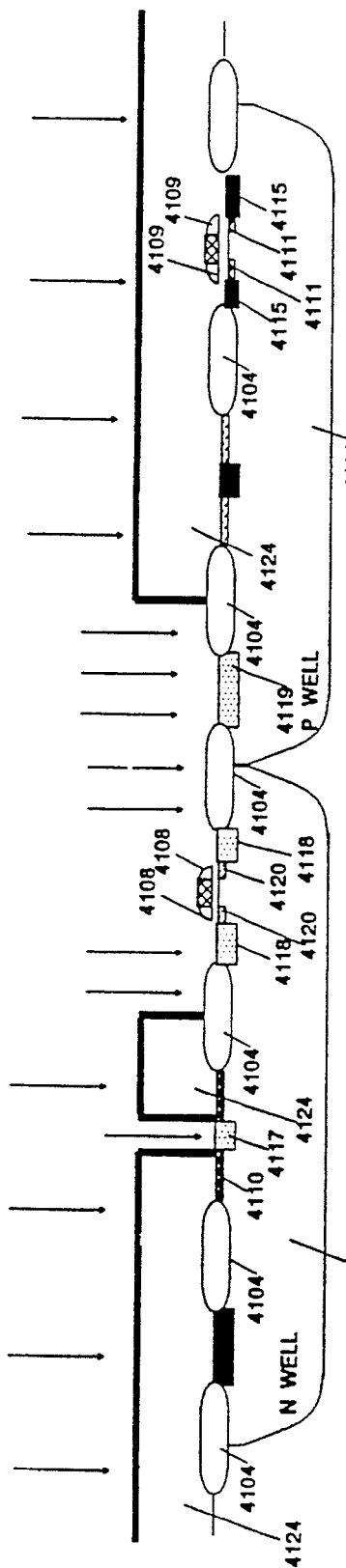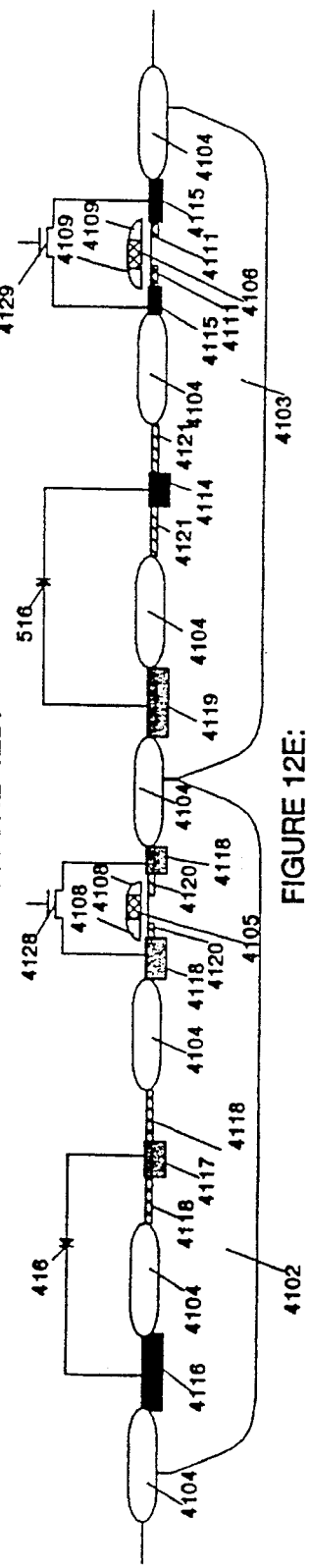

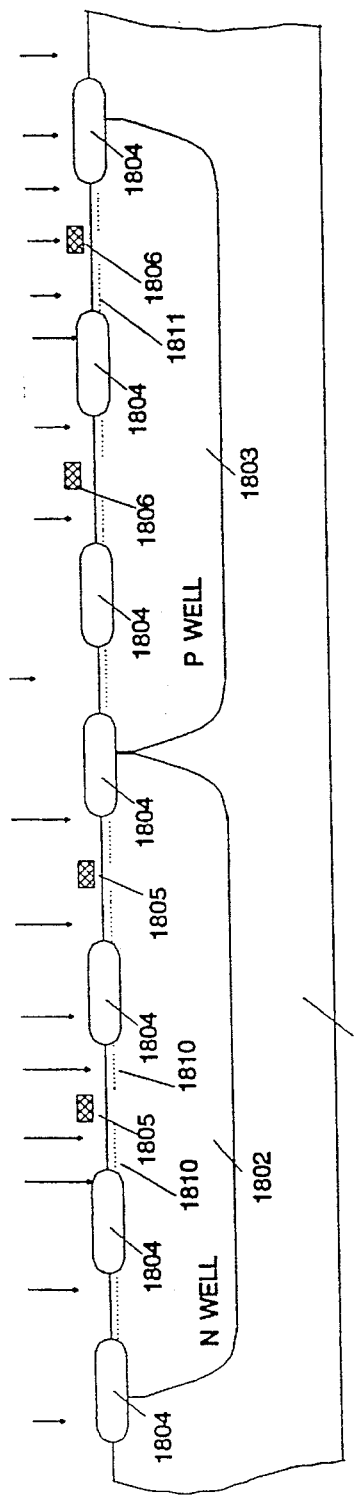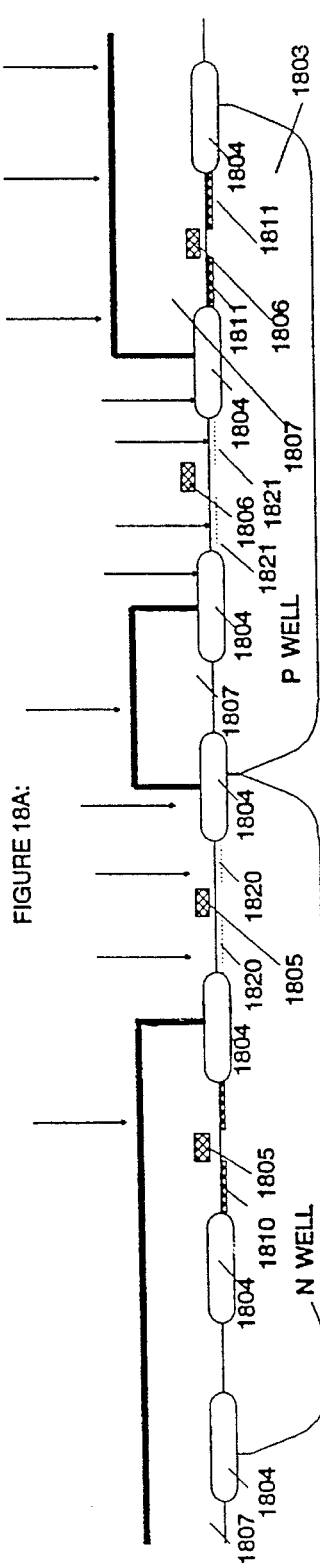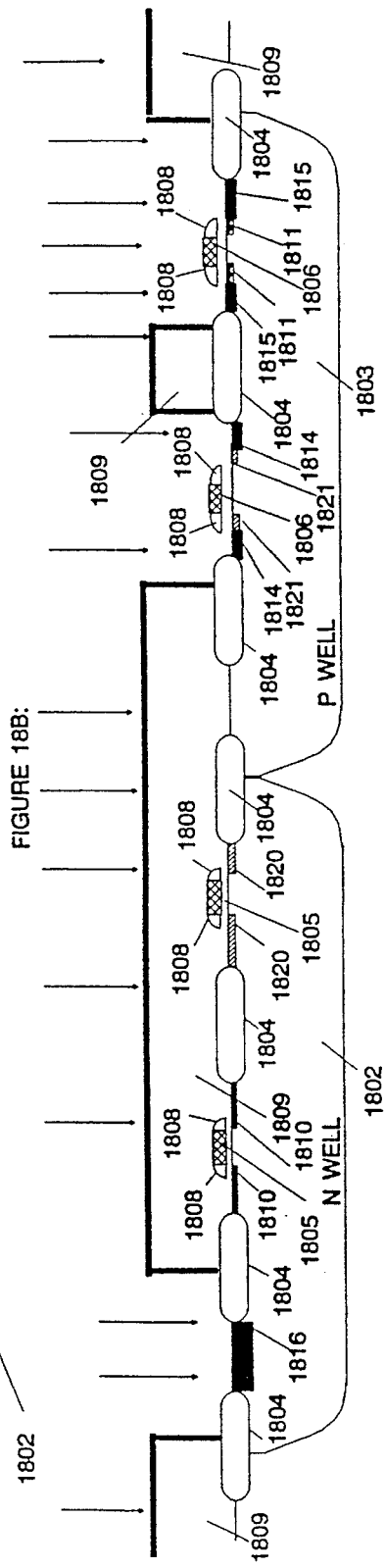

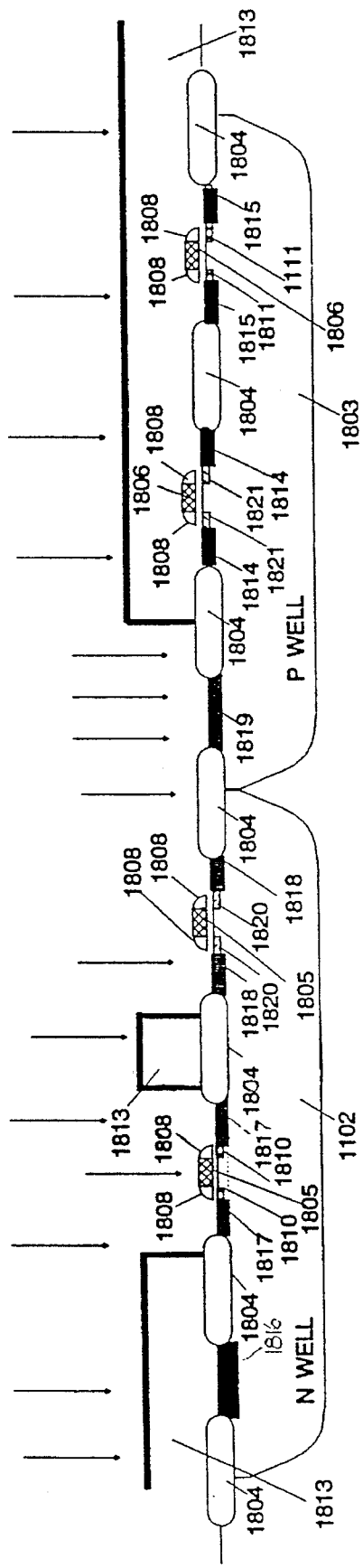
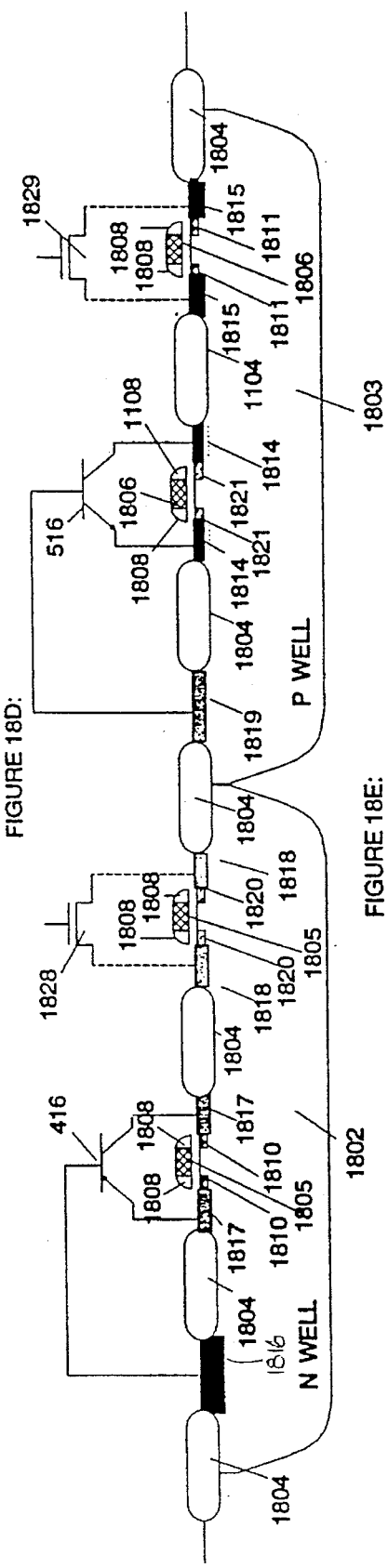
FIGURE 18D:
FIGURE 18E:

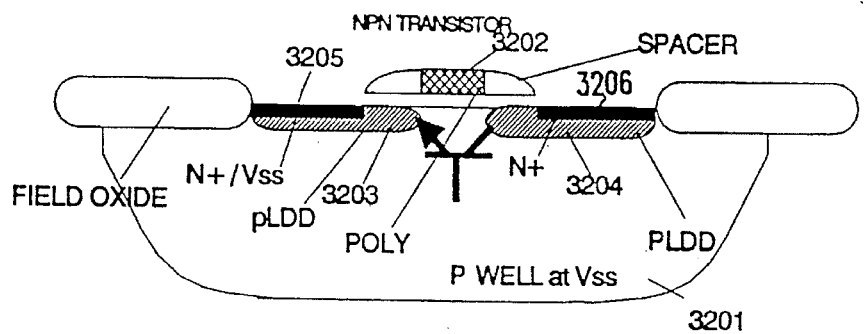
FIGURE 34a
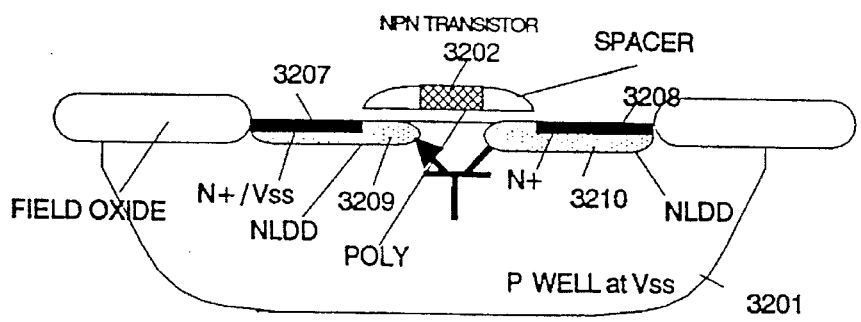
FIGURE 34b
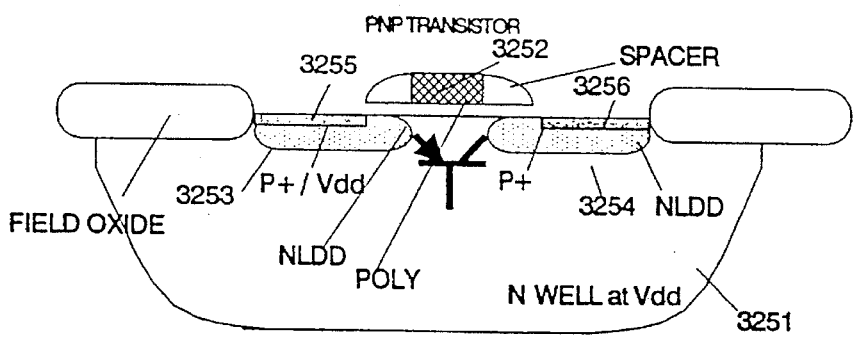
FIGURE 35a
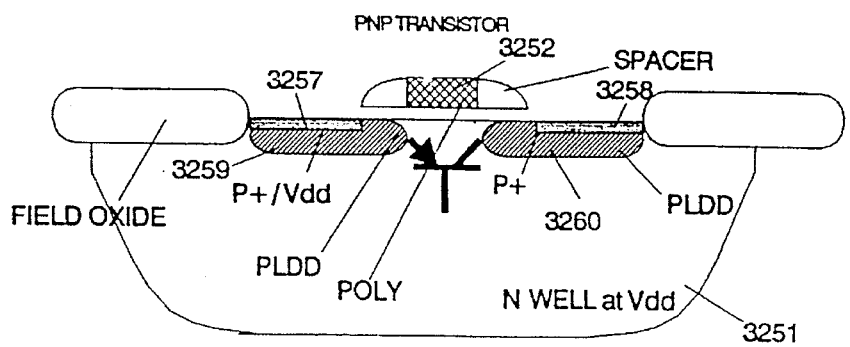
FIGURE 35b normal p channel cross seciton

METHOD FOR FABRICATING DEVICES FOR ELECTROSTATIC DISCHARGE PROTECTION AND VOLTAGE REFERENCES, AND THE RESULTING STRUCTURES

This application is a continuation in part of U.S. Ser. No. 08/093,074 filed Aug. 20, 1993, now U.S. Pat. No. 5,426, 322 which is a divisional of Ser. No. 07/864,933 filed Apr. 7, 1992 now U.S. Pat. No. 5,272,097

INTRODUCTION

TECHNICAL FIELD

This invention pertains to semiconductor devices, particularly with respect to electrostatic discharge protection.

BACKGROUND

CMOS integrated circuits of current technologies require very thorough protection against Electrostatic Discharge (ESD) phenomena. The susceptibility of VLSI CMOS circuits to excessive voltages and currents caused by ESD requires effective protection of all circuit pins. FIG. 1 shows the commonly used protection mechanism, where input protection circuits (PCI) 101a and 101b are used to protect input circuit 111 from undesired ESD voltages received on input pin 101. Similarly, output protection circuits (PCO) 102a and 102b protect output circuit 112 from undesired ESD voltages appearing on output pin 102. Voltage supply protection circuit (PCV) 103 protects the entire circuit from ESD voltages appearing on either one or both of the VSS and VDD supply pins. It has been reported in the article "Internal Chip ESD Phenomena Beyond the Protection Circuit" by Duvvury et. al., IEEE/IRPS, 1988, pages 19–25, that all commonly used protection circuits cause a circuit stress to the "protected" circuit. In other words, circuit protection as it exists today is not very effective.

The common ESD protection practice, as depicted in FIG. 2, is to use grounded gate thick or thin oxide transistors 201a, 201b, 202a, 202b. The drawback of using thin oxide transistors is that the breakdown voltage of the grounded gate transistor approaches the thin oxide breakdown voltage. The breakdown of these transistors in the grounded gate mode is approximately 13–17 volts, depending on dopant concentrations and distributions. The typical oxide breakdown is 15–17 volts for approximately 175 angstrom gate oxide and the grounded gate thin oxide breakdown is 12–14 volts. Thus, the breakdown margin between device breakdown may be inadequate at only several volts.

FIG. 3 is an illustration depicting the proximity of the breakdown region of the grounded gate thin oxide transistor, including source/drain regions 302, 303 lightly doped source/drain extensions 304, 305, thin gate oxide 301, polycrystalline silicon gate electrode 306, and sidewall spacers 307. The channel region is formed between the source/drain extensions 304, 305 within P well 310 in substrate 311. It is influenced by the control voltage applied to polycrystalline silicon gate 306, in this instance VSS, which is also applied to source/drain region 302. The input or output structure to be protected is connected to source/drain region 303. With the breakdown of the thin gate occurring in region 399 so close to thin gate oxide 301, a potentially unreliable device is created. The thin oxide grounded gate configuration is used because this device has a lower breakdown than the thick oxide field transistor; in fact it gives the lowest controlled breakdown voltage of all devices commonly available on the chip today. In fact the thick field transistor, whether operated as grounded gate or high gate, will probably surpass the breakdown voltage of the thin gate oxide and hence is useless for protection. Since the grounded gate thin oxide transistor has a breakdown between 12–14 volts, this limits the thinness of the gate oxide which may be used. The gate oxide breakdown must be greater than the protection device breakdown. Generally for low voltage lap top or portable operation, it is desirable to have maximum drive for a given threshold voltage. One way to accomplish this is by thinning the gate oxide to increase the $I_{dss}$ of the transistor. If the protection device is limited to 12 volts breakdown, at best this will limit gate oxide to at least 140 angstroms. On the other hand, if 8.0 volts is the breakdown of the protection device it would be possible to decrease the oxide thickness to approximately 100 angstroms. This would increase the drive by approximately 40% over the thin gate protected circuit.

The N+ and P+ diffusions available in CMOS processes may be used to make a diode but since these two diffusions are usually of such high concentrations, they lead to poor I/V characteristics, i.e., they are usually very leaky and have very poor V/I knee characteristics. These characteristics make such a diode a poor candidate for a protection device, having a typical breakdown of 4.5 volts, and unacceptably less than the typical 5.0 volt power supply voltage.

SUMMARY

In accordance with the teachings of this invention, a novel process is taught for forming diodes in a process which simultaneously forms MOS or CMOS devices. These diodes have relatively low breakdown voltage, making them suitable for ESD protection devices or as voltage reference diodes. In alternative embodiments, novel low breakdown voltage devices are fabricated in a similar fashion as MOS devices but with doping levels such that the inherent bipolar device has a low breakdown voltage characteristic. In alternative embodiments, novel vertical bipolar transistors are taught, as are SCR devices, having low breakdown voltage characteristics. In one embodiment of this invention, a low breakdown voltage device is integrated directly with a standard MOS transistor, allowing the low breakdown voltage device to trigger the turn on of the standard MOS device, thereby providing large current capacity controlled by the low breakdown voltage device.

BRIEF DESCRIPTION OF THE DRAWINGS

FIG. 1 is a schematic diagram depicting a typical prior art ESD protection scheme;

FIG. 2 is a schematic diagram depicting a typical prior art circuit implementing the ESD protection of FIG. 1;

FIG. 3 is a cross-sectional view of a typical MOS transistor used for ESD protection, showing its breakdown mechanism;

FIG. 4 is a cross-sectional view depicting one embodiment of a diode constructed within an N type region in accordance with the teachings of this invention;

FIG. 5 is a cross-sectional view depicting one embodiment of a diode constructed within a P type region in accordance with the teachings of this invention;

FIGS. 6 through 8 are schematic diagrams depicting various embodiments of ESD protection circuits utilizing the diodes constructed in accordance with the teachings of this invention;

FIGS. 9A through 9E are cross-sectional views depicting a fabrication sequence in accordance with one embodiment of this invention;

FIGS. 10A through 10E are cross-sectional views depicting a fabrication sequence in accordance with another embodiment of this invention;

FIGS. 11A through 11E are cross-sectional views depicting a fabrication sequence in accordance with another embodiment of this invention;

FIGS. 12A through 12E are cross-sectional views depicting a fabrication sequence in accordance with another embodiment of this invention;

FIGS. 18A through 18E are cross-sectional views depicting a fabrication sequence in accordance with another embodiment of this invention;

FIG. 34A and 34B are cross sectional views of the low breakdown voltage device and the standard MOS device, respectively, of the device depicted in the plan view of FIG. 32;

FIGS. 35A and 35B are cross sectional views of the low breakdown voltage device and the standard MOS device, respectively, of the device depicted in the plan view of FIG. 33.

DETAILED DESCRIPTION

Figure 8:
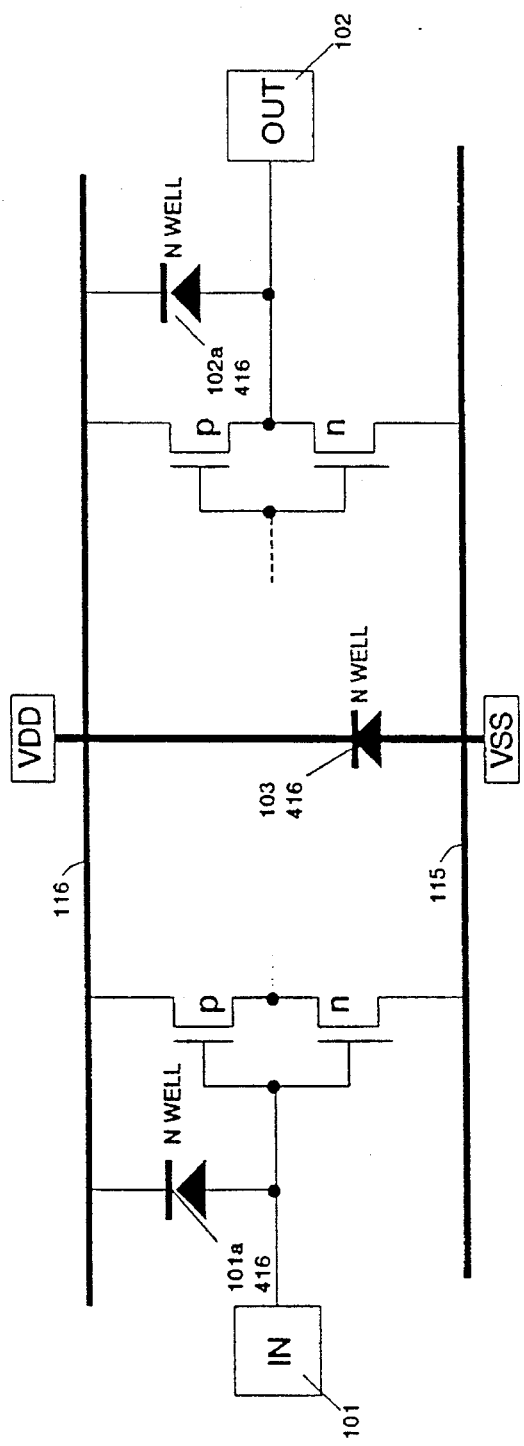

In accordance with the teachings of this invention, a low voltage protection device is taught which is capable of being fabricated simultaneously with the fabrication of typical prior art MOS or CMOS devices which include lightly doped drain devices. In accordance with the teachings of this invention, such protection devices are formed without the need for additional masking or implantation steps. The protection devices of this invention are compatible with the current process technology including one micron and smaller CMOS and MOS process flows. In accordance with the teachings of this invention, the use of lower breakdown voltage protection devices allows the use of thinner gate oxide, thereby enhancing operating speed and increasing transistor drive, without sacrificing reliability. Utilizing novel devices in accordance with the teachings of this invention for ESD protection alleviates the problem associated with prior art use of thin oxide transistors for this purpose, in which the thin oxide is placed at risk. In accordance with the teachings of this invention, series resistors are not needed in order to effectuate ESD protection, thereby saving integrated circuit area, as well as affording greater ESD protection by quickly dissipating ESD potentials through a low impedance path.

Examples of the protection devices of this invention are shown in cross-section in FIGS. 4 and 5. Since the diodes are formed in bulk CMOS, the N well diode has one side connected to VDD and the P well has one junction connected to VSS, as shown in FIGS. 4 and 5, respectively.

Referring to FIG. 4, within N type bulk 410 is formed N well 411, in a well known manner. Field oxide regions 412 are also formed in a well known manner in order to expose only those portions of the substrate surface which are of interest for electrical connections and further doping. Within N well 411 is formed N type regions 414 surrounding P+ region 413, and spaced apart N+ region 415. An N protection diode in accordance with the teachings of this invention, shown in representative format as diode 416, is formed having its anode as P+ region 413 and its cathode as N+ region 415. In this example, cathode 415 of protection diode 416 is connected to positive supply VDD, and anode 413 of protection diode 416 is connected to the input or output device to be protected (not shown). As shown in FIG. 4, reverse breakdown occurs in region 499 where N type region 414 and P+ anode 413 have their greatest dopant differential. In accordance with the teachings of this invention, N well protection diode 416 meets the requirement:

(VDD-VSS)<(diode breakdown voltage)<<(thin oxide breakdown voltage)    (1)

Referring to FIG. 5, within N type bulk 510 is formed P well 511, in a well known manner. Field oxide regions 512 are also formed in a well known manner in order to expose only those portions of the substrate surface which are of interest for electrical connections and further doping. Within P well 511 is formed P type regions 514 surrounding N+ region 513, and spaced apart P+ region 515. A P protection diode in accordance with the teachings of this invention, shown in representative format as diode 516, is formed having its anode as P+ region 515 and its cathode as N+ region 513. In this example, anode 515 of protection diode 516 is connected to negative supply VSS, and cathode 513 of protection diode 516 is connected to the input or output device to be protected (not shown). As shown in FIG. 5, reverse breakdown occurs in region 599 where P type region 514 and N+ cathode 513 have their greatest dopant differential.

FIG. 6 illustrates the use of novel diodes 416 and 516 of FIGS. 4 and 5, respectively, as VDD input protection diode 101a, VDD output protection diode 102a, and VSS input protection diode 101b, VSS output protection diode 102b, respectively. Voltage supply protection diode 103 can be fabricated as either N well diode 416 of FIG. 4 or P well diode 516 of FIG. 5. The breakdown voltage of the diodes fabricated in accordance with the teachings of this invention is on the order of approximately 8.0 volts. With the protection diodes utilized as shown, the actual protection offered by a diode of this invention is dependent on the size of the protection diode, with larger diodes capable of absorbing larger amounts of charge. Note that in this embodiment there is no thin oxide in the region of the breakdown of this structure, thus making the diodes of this invention more desirable for handling ESD than prior art devices.

FIGS. 7 and 8 show alternative embodiments in which protection diodes of this invention provide single ended protection only (protection to only a single power supply), but good protection is provided for both positive and negative ESD, respectively.

Referring to FIG. 7, a positive ESD pulse to input 101 reverse biases input protection diode 101b/516 and forces it into conduction when 8.0 volts is surpassed. The charge then passes to VSS line 115 which is protected by large protection diode 103, which shunts the charge to VDD line 116. On the other hand, a negative ESD pulse to input 101 forward biases input protection diode 101b/516 and the pulse passes to VSS line 115 which is protected by large protection diode 103, which conducts if 8.0 volts is exceeded. Large protection diode 103 limits VDD-VSS to 8.0 volts.

Still referring to FIG. 7, a positive ESD pulse to output 102 reverse biases output protection diode 102b/516 and forces it into conduction when 8.0 volts is surpassed. The charge then passes to VSS line 115 which is protected by large protection diode 103, which shunts the charge to VDD line 116. On the other hand, a negative ESD pulse to output 102 forward biases output protection diode 102b/516 and the pulse passes to VSS line 115 which is protected by large protection diode 103, which conducts if 8.0 volts is exceeded.

A similar ESD protection mechanism is shown in FIG. 8, in which a negative ESD pulse to input 101 reverse biases input protection diode 101a/416 and forces it into conduction when 8.0 volts is surpassed. The charge then passes to VDD line 116 which is protected by large protection diode 103, which shunts the charge to VSS line 115. On the other hand, a positive ESD pulse to input 101 forward biases input protection diode 101a/416 and the pulse passes to VDD line 116 which is protected by large protection diode 103, which conducts if 8.0 volts is exceeded. Thus, large protection diode 103 limits VDD-VSS to 8.0 volts. A negative ESD pulse to output 102 reverse biases output protection diode 102a/416 and forces it into conduction when 8.0 volts is surpassed. The charge then passes to VDD line 116 which is protected by large protection diode 103, which shunts the charge to VSS line 115. On the other hand, a positive ESD pulse to output 102 forward biases output protection diode 102a/416 and the pulse passes to VDD line 116 which is protected by large protection diode 103, which conducts if 8.0 volts is exceeded.

This 8.0 V diode can also be used as a reference diode in ±5.0 V linear circuit systems. In general, reference diodes are difficult to build in an advanced CMOS process because dopant concentrations of the appropriate level to make reliable diodes of low breakdowns are not available. The method of this invention overcomes the limitations of the prior art and provides very good reference diodes.

Figure 9A:
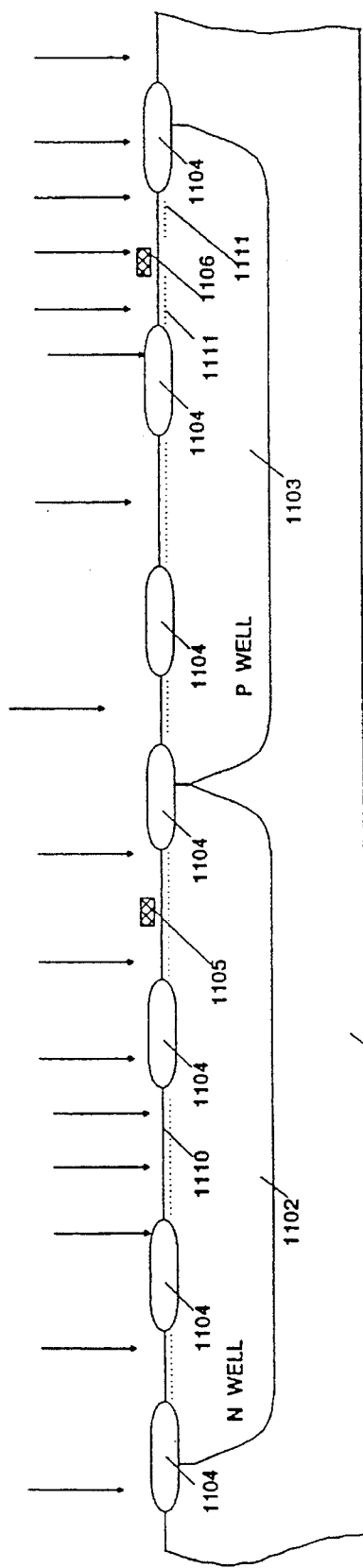

FIGS. 9A through 9E illustrate the fabrication steps of one embodiment of a method for constructing the novel diodes of the invention. Referring to FIG. 9A, substrate 1101 may be either an N type substrate or a P type substrate, as both N well 1102 and P well 1103 are formed therein. If desired, an N type substrate of desired doping may be used, thereby avoiding the need to form N well 1102 or a P type substrate of desired doping may be used, thereby avoiding the need to form P well 1103. N well 1102 is formed in a conventional manner, for example, having a dopant concentration providing a sheet resistivity of approximately 3000 ohms per square. Similarly, P well 1103 is formed in a conventional manner and has a dopant concentration providing, for example, a sheet resistivity of approximately 3000 ohms per square. A layer of field oxide 1104 is formed in a well known manner in order to expose those portions of N well 1102 and P well 1103 for which additional implants are to be performed. A layer of gate oxide (not shown) is then formed, for example, to a thickness of approximately 150 Å, and a layer of polycrystalline silicon is formed to a desired conductivity on that gate oxide and patterned in a conventional manner in order to form gate electrodes 1105 and 1106. A blanket N type implant is then performed, for example, using phosphorous dopants implanted to a dose of approximately 2.5E13 at approximately 60 KEV in order to provide a dopant concentration of approximately $2\times10^{18}/cm^3$. This forms N channel lightly doped drains 1111 and lightly doped N region 1110, as well as introducing dopants into the other exposed portions of the devices.

As shown in FIG. 9B, resist layer 1107 is used in order to expose only those portions in which a P type implant is desired. At this time, a P type implant is performed, for example, using boron implanted to a dose of approximately 6E13 at approximately 50 KEV to a net (i.e., over-compensated) dopant concentration of approximately $3E18/cm^3$. This forms lightly doped source/drain regions 1120 aligned to gate 1105 within N well 1102, and P type region 1121 within P well 1103. This P type region 1121 is sufficiently concentrated to compensate the previous N type implant in that same region, which was not necessary but introduced by way of convenience in order to allow the N type implant to be a blanket implant. Masking layer 1107 is removed and the device is then oxidized, forming sidewall spacers 1108 on gate electrodes 1105 and 1106. The oxide forming sidewall spacers 1108 is formed to a greater thickness on the sidewalls of polycrystalline silicon gates 1105 and 1106 than is the oxide which is simultaneously formed on single crystal portions of the device, as is well known in the art.

Referring to FIG. 9C, another masking layer 1109 is used to expose those portions of the device which are to receive an N type implant. This N type implant is performed, for example, using arsenic implanted to a dose of approximately 5.5E15 at approximately 60 KEV, to a sheet resistivity of approximately 75 ohms per square. This forms source/drain regions 1115 to a desired dopant concentration, while sidewall spacers 1108 maintain the previously established dopant level to provide lightly doped source/drain regions 1111, as is well known in the art. N+ region 1114 is also formed within P well 1103, as is N type region 1116 within N well 1102.

Referring to FIG. 9D, another masking layer 1113 is formed to expose those regions which are to receive a P+ implant, which is performed, for example, using boron ($BF_2$) implanted to a dose of approximately 5.5E15 at approximately 60 KEV to achieve a sheet resistivity of approximately 105 ohms per square. This forms P type source/drain regions 1118, while sidewall spacers 1108 maintain the previous doping level of P type lightly doped source/drain extensions 1120. P+ region 1117 is also formed within N well 1102, as is P+ region 1119 within P well 1103. This yields the device shown in the cross-section of FIG. 9E, including N well 1102 having P channel lightly doped drain device 1128 and novel diode 416 constructed in accordance with the teachings of this invention, and P well 1103 including N channel lightly doped drain device 1129 and novel diode 516 constructed in accordance with the teachings of this invention. Of interest, the structure shown in FIG. 9E includes novel diodes constructed in accordance with the teachings of this invention and typical prior art lightly doped drain (LDD) CMOS device fabricated utilizing a simple process without the need for additional masking steps in order to form the additional diodes of this invention. As an alternative embodiment, some or all of the lightly doped drain regions associated with the low breakdown voltage devices of this and subsequent embodiments can be made to be deeper than their associated source/drain regions, as later described with respect to FIG. 21A, for example.

FIGS. 10A through 10E illustrate the fabrication steps of an alternative embodiment of a method for constructing the novel diodes of the invention. Referring to FIG. 10A, substrate 2101 may be either an N type substrate or a P type substrate, as both N well 2102 and P well 2103 are formed therein. If desired, an N type substrate of desired doping may be used, thereby avoiding the need to form N well 2102 or a P type substrate of desired doping may be used, thereby avoiding the need to form P well 2103. N well 2102 is formed in a conventional manner, for example, having a dopant concentration providing a sheet resistivity of approximately 3000 ohms per square. Similarly, P well 2103 is formed in a conventional manner and having a dopant concentration, for example, providing a sheet resistivity of approximately 3000 ohms per square. A layer of field oxide 2104 is formed in a well known manner in order to expose those portions of N well 2102 and P well 2103 for which additional implants are to be performed. A layer of gate oxide (not shown) is then formed, for example, to a thickness of approximately 150 Å, and a layer of polycrystalline silicon is formed to a desired conductivity on that gate oxide and patterned in a conventional manner in order to form P channel gate electrode 2105 and N channel gate electrode 2106. Masking layer 2107 is formed and patterned, and an N type implant is then performed, for example, using phosphorous dopants implanted to a dose of approximately 2.5E13 at approximately 60 KEV in order to form a dopant concentration of approximately $2\times10^{18}/cm^3$. This forms lightly doped source/drain regions 2111 aligned to gate 2106 within N well 2103 and lightly doped N region 2110 within N well 2103.

As shown in FIG. 10B, resist layer 2109 is used in order to expose only those portions in which a first P type implant is desired. At this time, a P type implant is performed, for example, using boron implanted to a dose of approximately 2E13 at approximately 50 KEV to a dopant concentration of approximately $3E18/cm^3$. This forms lightly doped source/drain regions 2120 aligned to gate 2105 within N well 2102, and P type region 2121 within P well 2103. Masking layer 2109 is then removed and the device is oxidized, forming sidewall spacers 2108 and 2109 on gate electrodes 2105 and 2106, respectively (FIG. 10C). The oxide forming the sidewall spacers is formed to a greater thickness on the sidewalls of the polycrystalline silicon gate electrodes than is the oxide which is simultaneously formed on single crystalline portions of the device.

Referring to FIG. 10C, another masking layer 2113 is used to expose those portions of the device which are to receive an N type implant. This N type implant is performed, for example, using arsenic implanted to a dose of approximately 5.5E15 at approximately 60 KEV, to a sheet resistivity of approximately 75 ohms per square. This forms source/drain regions 2115 to a desired dopant concentration, while sidewall spacers 2109 maintain the previously established dopant level of lightly doped source/drain extensions 2111, as is well known in the art. N+ region 2114 is also formed within P well 2103, as is N type region 2116 within N well 2102.

Referring to FIG. 10D, another masking layer 2124 is formed to expose those regions which are to receive a second P type implant which is performed, for example, using boron ($BF_2$) implanted to a dose of approximately 5.5E15 at approximately 60 KEV to achieve a sheet resistivity of approximately 105 ohms per square. This forms P type source/drain regions 2118, while sidewall spacers 2108 maintain the previous doping level of P type lightly doped source/drain extensions 2120. P+ region 2117 is also formed within N well 2102, as is P+ region 119 within P well 2103. This yields the device shown in the cross-section of FIG. 10E, including N well 2102 having P channel lightly doped drain device 2128 and novel diode 416 constructed in accordance with the reachings of this invention, and P well 2103 including N channel lightly doped drain device 2129 and novel diode 516 constructed in accordance with the teachings of this invention. Of interest, the structure shown in FIG. 10E includes novel diodes constructed in accordance with the teachings of this invention and typical prior art lightly doped drain (LDD) CMOS device fabricated utilizing a simple process without the need for additional masking steps in order to form the additional diodes of this invention. The process of FIG. 10 avoids the blanket N type implant of the process of FIG. 9, and thus the need to over-compensate with P type dopants to form P type regions.

FIGS. 11A through 11E illustrate the fabrication steps of another alternative embodiment of a method for constructing the novel diodes of the invention. Referring to FIG. 11A, substrate 3101 may be either an N type substrate or a P type substrate, as both N well 3102 and P well 3103 are formed therein. If desired, an N type substrate of desired doping may be used, thereby avoiding the need to form N well 3102 or a P type substrate of desired doping may be used, thereby avoiding the need to form P well 3103. N well 3102 is formed in a conventional manner, for example, having a dopant concentration providing a sheet resistivity of approximately 3000 ohms per square. Similarly, P well 3103 is formed in a conventional manner and having a dopant concentration, for example, providing a sheet resistivity of approximately 3000 ohms per square. A layer of field oxide 3104 is formed in a well known manner in order to expose those portions of N well 3102 and P well 3103 for which additional implants are to be performed. A layer of gate oxide (not shown) is then formed, for example, to a thickness of approximately 150 Å, and a layer of polycrystalline silicon is formed to a desired conductivity on that gate oxide and patterned in a conventional manner in order to form gate electrodes 3105 and 3106. Masking layer 3201 is then formed and patterned as shown, and an implant is then used to form lightly doped N region 3110. This implant is performed, for example, using phosphorous dopants implanted to a dose of approximately 2.5E13 at approximately 60 KEV in order to form a dopant concentration of approximately $2\times10^{18}/cm^3$. In this embodiment, lightly doped drain regions 3115 and 3120 (FIG. 11B) are formed in a well known manner, for example either prior to the masking step which utilizes masking layer 3201, or after one or both of the masking steps which utilize masking layers 3201 and 3107. The device is then oxidized, forming sidewall spacers 3108 and 3109 (FIG. 11C) on gate electrodes 3105 and 3106, respectively. The oxide forming these sidewall spacers is formed to a greater thickness on the sidewalls of the polycrystalline silicon gates than is the oxide which is simultaneously formed on the single crystalline portions of the device.

As shown in FIG. 11B, resist layer 3107 is used in order to expose only those portions in which a lightly doped P type region 3121 is to be formed. At this time, a P type implant is performed, for example, using boron implanted to a dose of approximately 6E13 at approximately 50 KEV to a dopant concentration of approximately $3E18/cm^3$.

Referring to FIG. 11C, another masking layer 3113 is used to expose those portions of the device which are to receive an N type implant. This N type implant is performed, for example, using arsenic implanted to a dose of approximately 5.5E15 at approximately 60 KEV, to a sheet resistivity of approximately 75 ohms per square. This forms source/drain regions 3111 to a desired dopant concentration, while sidewall spacers 3109 maintain the previously established dopant level of lightly doped source/drain regions 3115, as is well known in the art. N+ region 3114 is also formed within P well 3103, as is N type region 3116 within N well 3102.

Referring to FIG. 11D, another masking layer 3124 is formed to expose those regions which are to receive a P+ implant, which is performed, for example, using boron ($BF_2$) implanted to a dose of approximately 6E15 at approximately 60 KEV to achieve a sheet resistivity of approximately 105 ohms per square. This forms P type source/drain regions 3118, while sidewall spacers 3108 maintain the previous doping level of P type source/drain extensions 3120. P+ region 3117 is also formed within N well 3102, as is P+ region 3119 within P well 3103. This yields the device shown in the cross-section of FIG. 11E, including N well 3102 having P channel lightly doped drain device 3128 and novel diode 416 constructed in accordance with the teachings of this invention, and P well 3103 including N channel lightly doped drain device 3129 and novel diode 516 constructed in accordance with the teachings of this invention. Of interest, the structure shown in FIG. 11E includes novel diodes constructed in accordance with the teachings of this invention and typical prior art lightly doped drain (LDD) CMOS device fabricated with additional masking steps in order to form the additional diodes of this invention.

FIGS. 12A through 12E illustrate the fabrication steps of an alternative embodiment of a method for constructing the novel diodes of the invention. Referring to FIG. 12A, substrate 4101 may be either an N type substrate or a P type substrate, as both N well 4102 and P well 4103 are formed therein. If desired, an N type substrate of desired doping may be used, thereby avoiding the need to form N well 4102 or a P type substrate of desired doping may be used, thereby avoiding the need to form P well 4103. N well 4102 is formed in a conventional manner, for example, having a dopant concentration providing a sheet resistivity of approximately 3000 ohms per square. Similarly, P well 4103 is formed in a conventional manner and having a dopant concentration, for example, providing a sheet resistivity of approximately 3000 ohms per square. A layer of field oxide 4104 is formed in a well known manner in order to expose those portions of N well 4102 and P well 4103 for which additional implants are to be performed. A layer of gate oxide (not shown) is then formed, for example, to a thickness of approximately 150 Å, and a layer of polycrystalline silicon is formed to a desired conductivity on that gate oxide and patterned in a conventional manner in order to form P channel gate electrode 4105 and N channel gate electrode 4106. A masking layer 4107 is formed and patterned, and an N type implant is then performed, for example, using phosphorous dopants implanted to a dose of approximately 2.5E13 at approximately 60 KEV in order to form a dopant concentration of approximately $2\times10^{18}/cm^3$. This forms lightly doped drain regions 4111 and lightly doped N region 4110, as well as implanting N type dopants into other exposed portions of the device.

As shown in FIG. 12B, resist layer 4109 is used in order to expose only those portions in which a first P type implant is desired. At this time, a P type implant is performed, for example, using boron implanted to a dose of approximately 2E13 at approximately 50 KEV to a dopant concentration of approximately $3E18/cm^3$. This forms lightly doped source/drain regions 4120 aligned to gate 4105 within N well 4102, and P type region 4121 within P well 4103. Masking layer 4109 is removed and sidewall spacers 4108 and 4109 (FIG. 12C) are now formed on gate electrodes 4105 and 4106, respectively. The oxide forming these sidewall spacers is formed to a greater thickness on the sidewalls of the polycrystalline silicon gate electrodes than is the oxide which is simultaneously formed on single crystalline portions of the device.

Referring to FIG. 12C, another masking layer 4113 is used to expose those portions of the device which are to receive an N type implant. This N type implant is performed, for example, using arsenic implanted to a dose of approximately 5.5E15 at approximately 60 KEV, to a sheet resistivity of approximately 75 ohms per square. This forms source/drain regions 4115 to a desired dopant concentration, while sidewall spacers 4109 maintain the previously established dopant level of lightly doped source/drain regions 4111, as is well known in the art. N+ region 4114 is also formed within P well 4103, as is N type region 4116 within N well 4102.

Referring to FIG. 12D, another masking layer 4124 is formed to expose those regions which are to receive a second P type implant which is performed, for example, using boron ($BF_2$) implanted to a dose of approximately 5.5E15 at approximately 60 KEV to achieve a sheet resistivity of approximately 105 ohms per square. This forms P type source/drain regions 4118, while sidewall spacers 4108 maintain the previous doping level of P type lightly doped source/drain extensions 4120. P+ region 4117 is also formed within N well 4102, as is P+ region 4119 within P well 4103. This yields the device shown in the cross-section of FIG. 12E, including N well 4102 having P channel lightly doped drain device 4128 and novel diode 416 constructed in accordance with the teachings of this invention, and P well 4103 including N channel lightly doped drain device 4129 and novel diode 516 constructed in accordance with the teachings of this invention. Of interest, the structure shown in FIG. 12E includes novel diodes constructed in accordance with the teachings of this invention and typical prior art lightly doped drain (LDD) CMOS device fabricated utilizing a simple process without the need for additional masking steps in order to form the additional diodes of this invention. The process of FIG. 12 avoids the blanket N type implant of the process of FIG. 9, and thus the need to over-compensate with P type dopants to form P type regions. Also of interest, masking layer 4107 serves to block the N type implant into region 4121, thereby allowing this region 4121 to have a net more highly P type concentration. This reduces the breakdown voltage of the resultant diode 516 (FIG. 12E).

Alternative methods of N+ and P+ doping are suitable, for example, use of polycrystalline silicon barriers and oxide barriers of the source drain regions, in accordance with the teachings of this invention in which increased N well and P well concentrations are provided using the respective LDD diffusions. This protection method may be used in processes which utilize other gate materials, such as silicides and metal.

BiCMOS devices also utilize LDD diffusions as in CMOS, and accordingly the method of this invention is suitable for use with BiCMOS circuits.

Figure 13:
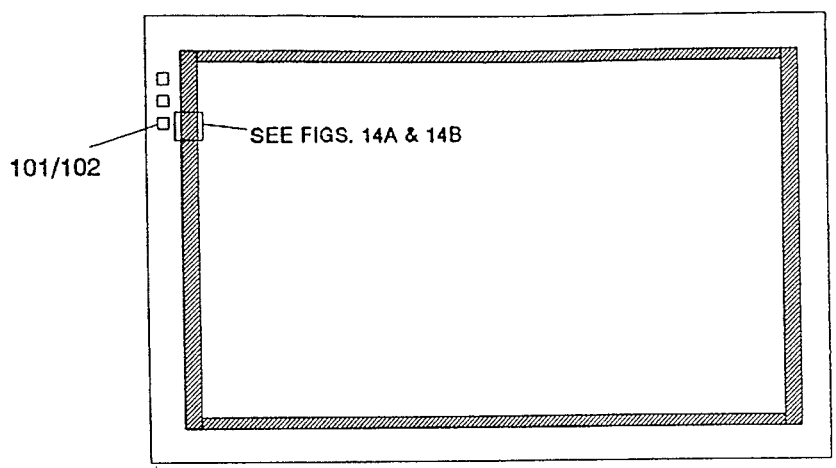
FIG. 13 is a plan view depicting one embodiment of the placement of diodes constructed in accordance with the teachings of this invention in an integrated circuit.

One embodiment of ESD protection devices in use in accordance with this invention is illustrated in the plan view of FIG. 13. In this embodiment, the outer edge of an integrated circuit (but within the location of bending pads 101/102) is encircled (although not necessarily completely) with the protection diodes of this invention.

Figure 14A:
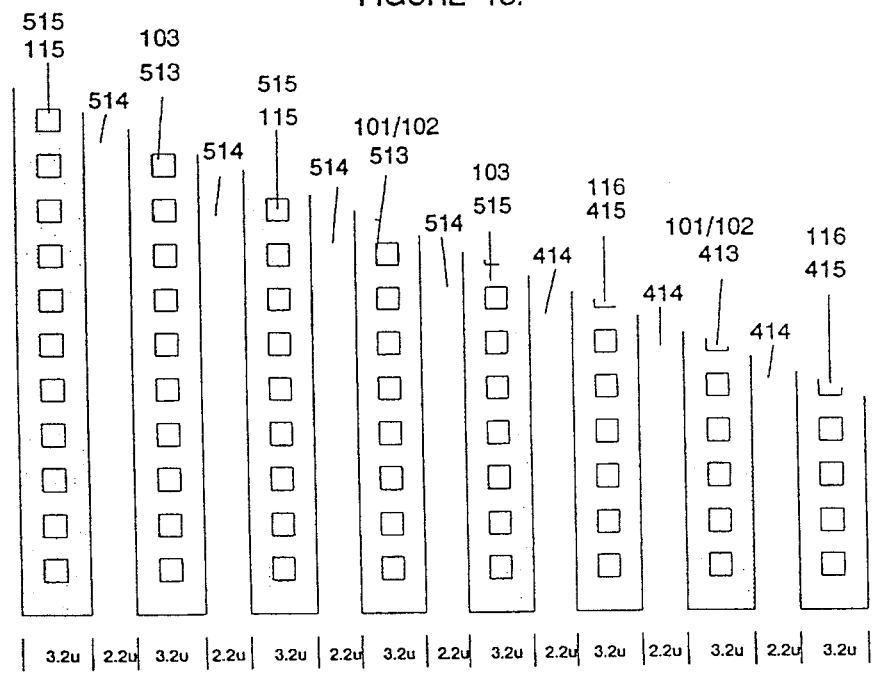
FIGS. 14A and 14B are top and cross-sectional views, respectively, depicting diodes constructed in accordance with the teachings of this invention.
Figure 14B:
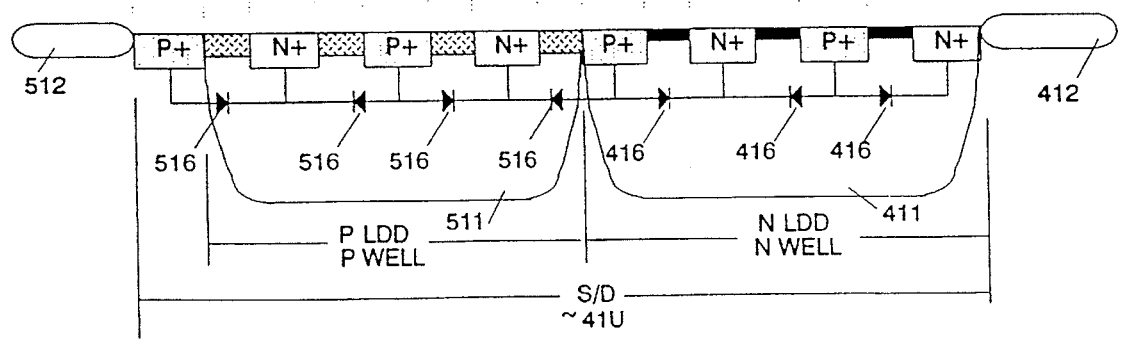

FIG. 14A shows a more detailed plan view of the highlighted portion of the chip shown in FIG. 13. As shown, the peripheral ring includes a plurality of diffused regions formed within P well 511 and N well 411. Reference numerals are used in FIG. 14A which correspond with those utilized in FIGS. 4, 5, and 6. FIG. 14B is a cross sectional view depicting the structure of FIG. 14A, using similar reference numerals. Also shown in FIG. 14B are the diodes constructed in accordance with the teachings of this invention. If desired, metal strapping can be used to provide low impedance paths, for example, for VSS and VDD diffusion, as well as the remaining diffusions shown in FIG. 14A. Also, any number of diffusion strips can be utilized in this fashion, thereby providing a desired number of ESD protection diodes. If desired, only a single bulk region need be employed in this fashion, to provide diodes for ESD protection as described earlier with reference to FIGS. 7 and 8.

Figure 15:
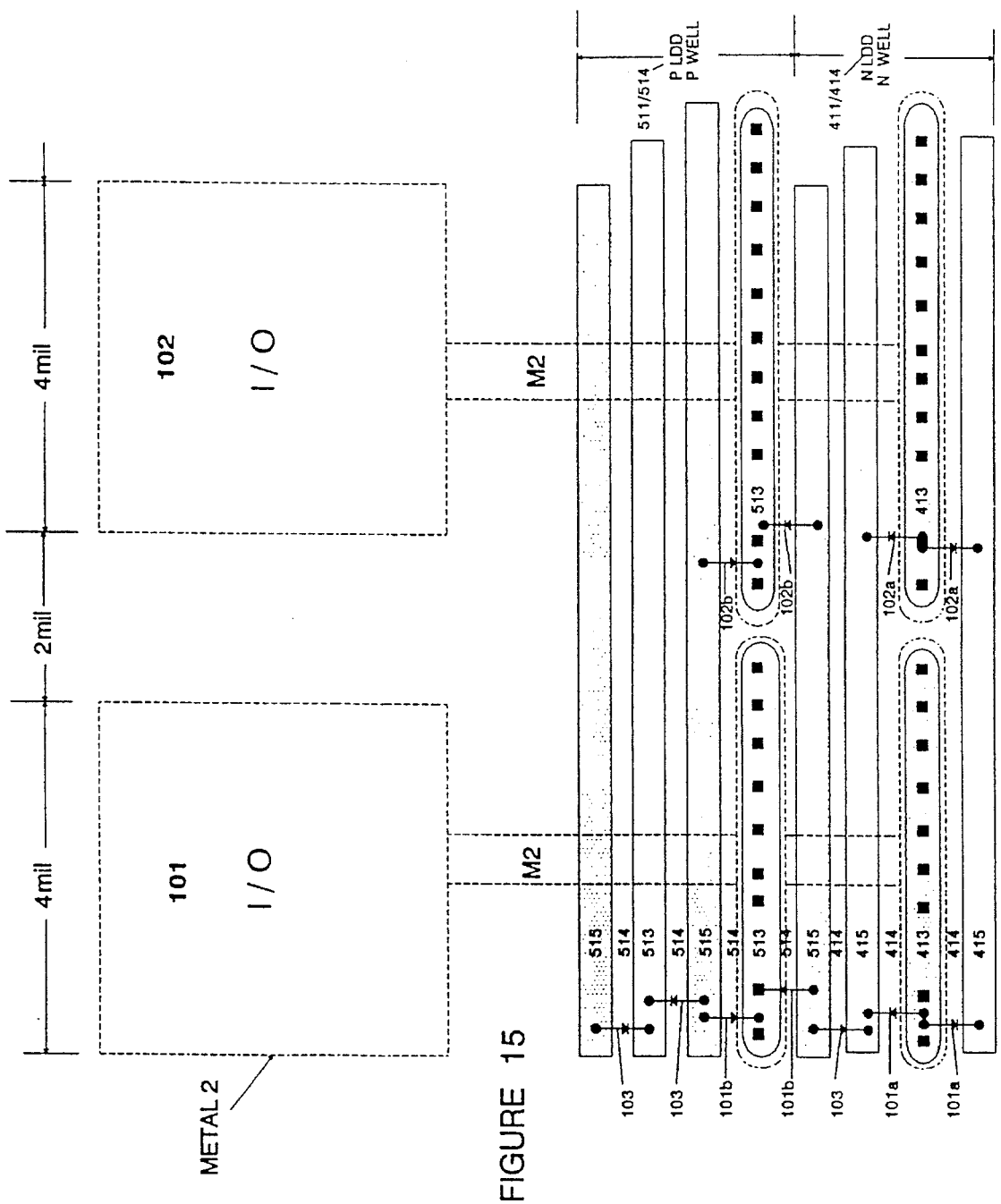
FIG. 15 is a plan view including bonding pads.

FIG. 15 is a more detailed plan view of the structure of FIG. 14A, including input bonding pad 101 and output bonding pad 102. As shown in FIG. 14B, P+ region 515 may be formed outside of P well 511, thereby affording space savings as compared to the embodiment shown in the cross-sectional view of FIG. 5 in which P+ region 515 is formed within P well 511 and separated from region 514 by field oxide 512. Similarly, as shown in the cross-sectional view of FIG. 14B, space savings is achieved by including N+ region 415 within N well 411 and not separated from diffused region 414 by field oxide 412, as is the case in the cross-sectional embodiment of FIG. 4. Diodes are depicted between various diffused regions, and are numbered in accordance with the numbering scheme utilized in FIG. 6. As shown, a second layer of metal M2 is used to connect bonding pads 101 and 102 to their respective diffused regions which in turn form one terminal of the protection diodes constructed in accordance with the teachings of this invention.

Figure 16:
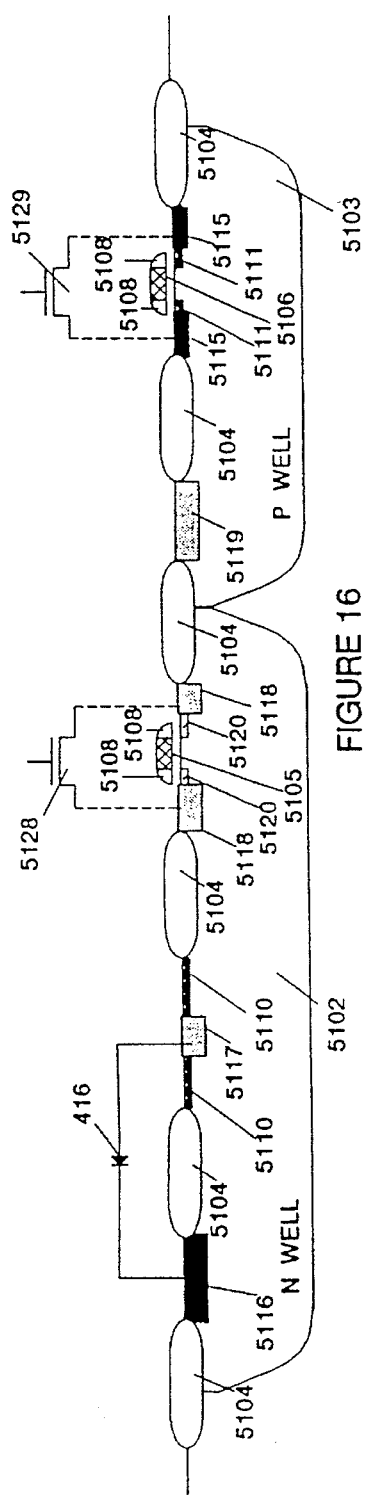
FIG. 16 is a cross sectional view of an alternative embodiment.

FIG. 16 is a cross sectional view depicting an alternative embodiment in which CMOS devices are formed together with a novel diode of this invention in only one bulk region, as described above with reference to FIG. 8. In FIG. 16, P well 5103 includes N channel MOS device 5129 and P type P well contact 5119. N well 5102 includes P channel MOS device 5128 (which need not include lightly doped source/drain regions), and novel diode 416.

Figure 17:
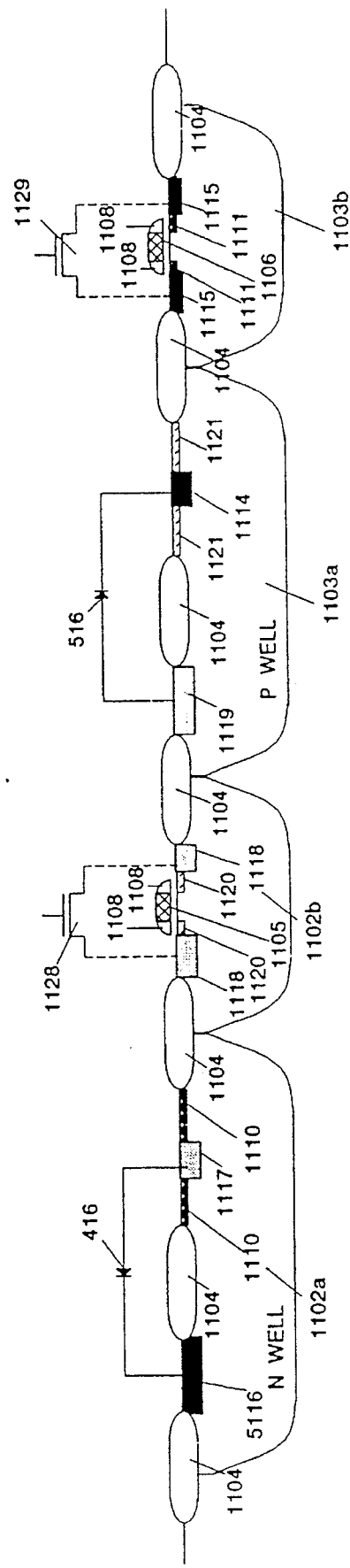
FIG. 17 is a cross sectional view of yet another embodiment.

FIG. 17 depicts an alternative embodiment in which two separate N wells 1102a and 1102b are used, with N well 1102a including one or more novel diodes of this invention and N well 1102b containing one or more MOS devices. Similarly, two separate P wells 1103a and 1103b are used, with P well 1103a including one or move novel diodes of this invention and with P well 1103b including one or more N channel devices. Of interest, the entire structure formed within wells 1102a, 1102b, 1103a, and 1103b are formed simultaneously utilizing a single process sequence.

Likewise, it is to be understood that the embodiment of FIG. 16 can be modified to include two separate N wells, one containing a novel diode of this invention and one containing a P channel device. Similarly, it is to be understood that the embodiment of FIG. 16 can be reversed such that there is one or more P wells including an N channel device and a novel diode of this invention, and a single N well including a P channel device.

Accordingly, as taught by way of the representative examples described herein, a novel ESD protection scheme is taught in which novel semiconductor diodes are fabricated simultaneously with the formation of typical prior art LDD MOS devices.

In accordance with the teachings of this invention, ESD protection is provided with greater area efficiency than with prior art ESD protection techniques which utilize thin oxide transistors. When utilizing a thin oxide transistor for ESD protection as in the prior art, only that portion of the drain adjacent the gate electrode provides enhanced breakdown and thus ESD protection. Conversely, in accordance with the teachings of this invention, within about the same area required to form a single thin gate oxide protection device two novel diodes of this invention may be formed, each providing ESD protection. Furthermore, in prior art techniques which utilize thin gate oxide transistors, the drain contacts which will carry the undesirably high ESD voltage must be spaced an appropriate distance from the gate electrode in order to prevent destruction of the thin gate oxide transistor, for example either due to thin gate oxide breakdown, or aluminum migration from the aluminum drain contact to the gate electrode. In accordance with the teachings of this invention, since thin gate oxide is not used, the placement of contacts is of little concern.

FIGS. 18A through 18E depict cross-sectional views of one embodiment of a process for constructing an alternative embodiment of this invention. The embodiment shown in FIGS. 18A through 18E is somewhat similar to that of FIGS. 9A through 9E discussed previously with respect to the early masking steps which differentiate the embodiments of FIGS. 9, 10, and 11, and 12. However, it will be appreciated by those of ordinary skill in the art in light of the teachings of this specification that the alternative features of the embodiment of FIGS. 18A through 18E can likewise be applied to the embodiments of FIGS. 10, 11, and 12 as well.

In accordance with the embodiment of FIG. 18, the ESD protection devices formed within N well 1802 and P well 1803 are formed in a more convenient fashion as an MOS device which inherently includes parasitic bipolar transistors.

An exemplary description of a process suitable for fabrication of the embodiment of FIG. 18A through 18E is now described, in which substrate 1801 may be either an N type substrate or a P type substrate, as both N well 1802 and P well 1803 are formed therein. If desired, an N type substrate of desired doping may be used, thereby avoiding the need to form N well 1802 or a P type substrate of desired doping may be used, thereby avoiding the need to form P well 1803. N well 1802 is formed in a conventional manner, for example, having a dopant concentration providing a sheet resistivity of approximately 3000 ohms per square. Similarly, P well 1803 is formed in a conventional manner and has a dopant concentration providing, for example, a sheet resistivity of approximately 3000 ohms per square. A layer of field oxide 1804 is formed in a well Known manner in order to expose those portions of N well 1802 and P well 1803 for which additional implants are to be performed. A layer of gate oxide (not shown) is then formed, for example, to a thickness of approximately 150 Å, and a layer of polycrystalline silicon is formed to a desired conductivity on that gate oxide and patterned in a conventional manner in order to form gate electrodes 1805 and 1806. A blanket N type implant is then performed, for example, using phosphorous dopants implanted to a dose of approximately 2.5E13 at approximately 60 KEV in order to provide a dopant concentration of approximately $2 \times 10^{18}/cm^3$. This forms N channel lightly doped drains 1811 and lightly doped N type regions 1810, as well as introducing dopants into the other exposed portions of the devices.

As shown in FIG. 18B, resist layer 1807 is used in order to expose only those portions in which a P type implant is desired. At this time, a P type implant is performed, for example, using boron implanted to a dose of approximately 6E13 at approximately 50 KEV to a net (i.e., over-compensated) dopant concentration of approximately $3E18/cm^3$. This forms lightly doped source/drain regions 1820 aligned to gate 1805 within N well 1802, and P type regions 1821 within P well 1803. These P type regions 1821 are self-aligned to polycrystalline silicon gate electrode 1806 and are formed to a dopant concentration of approximately 3E18/ $cm^3$ of P type material, which is sufficiently concentrated to compensate the previous N type implant in that same region, which was not necessary but introduced by way of convenience in order to allow the N type implant to be a blanket implant. Masking layer 1807 is removed and the device is then oxidized, forming sidewall spacers 1808 on gate electrodes 1805 and 1806. The oxide forming sidewall spacers 1808 is formed to a greater thickness on the sidewalls of polycrystalline silicon gates 1805 and 1806 than is the oxide which is simultaneously formed on single crystal portions of the device, as is well known in the art.

Referring to FIG. 18C, another masking layer 1809 is used to expose those portions of the device which are to receive an N type implant. This N type implant is performed, for example, using arsenic implanted to a dose of approximately 5.5E15 at approximately 60 KEV, to a sheet resistivity of approximately 75 ohms per square. This forms N+ source/drain regions 1815 to a desired dopant concentration, while sidewall spacers 1808 maintain the previously established dopant level to provide lightly doped source/drain regions 1811, as is well known in the art. N+ regions 1814 are also formed within P well 1803, as is N+ type region 1816 within N well 1802. While FIG. 18C shows an embodiment in which N+ regions 1814 associated with devices 516 are formed deeper than are lightly doped P type regions 1821, in an alternative embodiment of this invention lightly doped P type regions 1821 are formed to a greater junction depth than are N+ regions 1814, as is further described later in this specification.

Referring to FIG. 18D, another masking layer 1813 is formed to expose those regions which are to receive a P+ implant, which is performed, for example, using boron ($BF_2$) implanted to a dose of approximately 5.5E15 at approximately 60 KEV to achieve a sheet resistivity of approximately 105 ohms per square. This forms P type source/drain regions 1818, while sidewall spacers 1808 maintain the previous doping level of P type lightly doped source/drain extensions 1820. P+ regions 1817 adjacent lightly doped N type regions 1810 are also formed within N well 1802, as is P+ region 1819 within P well 1803. In one embodiment, P+ regions 1817 are formed to a dopant concentration of approximately $3E18/cm^3$, which is sufficient to overcome the previous doping in this region. This yields the device shown in the cross-section of FIG. 18E, including N well 1802 having P channel lightly doped drain device 1828 and novel device 416 constructed in accordance with the teachings of this invention, and P well 1803 including N channel lightly doped drain device 1829 and novel device 516 constructed in accordance with the teachings of this invention. Of interest, the structure shown in FIG. 18E includes novel devices constructed in accordance with the teachings of this invention and typical prior art lightly doped drain (LDD) CMOS device fabricated utilizing a simple process without the need for additional masking steps in order to form the additional devices of this invention. While FIG. 18D shows an embodiment in which P+ regions 1817 associated with device 416 are formed deeper than are lightly doped N type regions 1810, in an alternative embodiment of this invention lightly doped N type regions 1810 are formed to a greater junction depth than are P+ regions 1817, as is further described later in this specification.

In the embodiment of FIGS. 18A through 18E, the resulting ESD protection devices are actually formed as MOS transistor structures, although their associated control gates 1805 and 1806 are not used, and in fact can be tied to any convenient voltage since those "transistors" are doped by their respective lightly doped drain regions, and thus will not have a channel inversion unless very high voltages are placed on the control gate. Thus, these control gates 1805 and 1806 can, if desired, be removed, or can be used as a first layer of polycrystalline silicon interconnect. In fact, in accordance with the teachings of this invention, novel low voltage breakdown devices 416 and 516 are formed as shown schematically in FIG. 18E as PNP and NPN parasitic transistors, respectively, which provide a low breakdown voltage of approximately five to eight volts, as desired and in keeping with the previous embodiments of FIGS. 9 through 12. An advantage of the embodiment of FIGS. 18A through 18E is that masking is in certain situations simpler and more easily performed when making the respective lightly doped drain implants, and makes use of the oxide sidewall spacers which are formed in a typical CMOS process utilizing sidewall spacers. Thus, the only mask modification in accordance with this embodiment is a change in the lightly doped drain mask in order to form the appropriate lightly doped drain regions to create the low breakdown voltage structures of this invention. However, this is merely a change in the mask layout, and no additional masking or other processing steps are required. In the embodiment of FIGS. 18A through 18E, the lightly doped drain regions of the low voltage breakdown devices are of the same dopant type as its respective well, i.e. within N well 1802 is formed lightly doped N regions 1810, and within P well 1803 are formed lightly doped P type regions 1821.

Figure 19A:
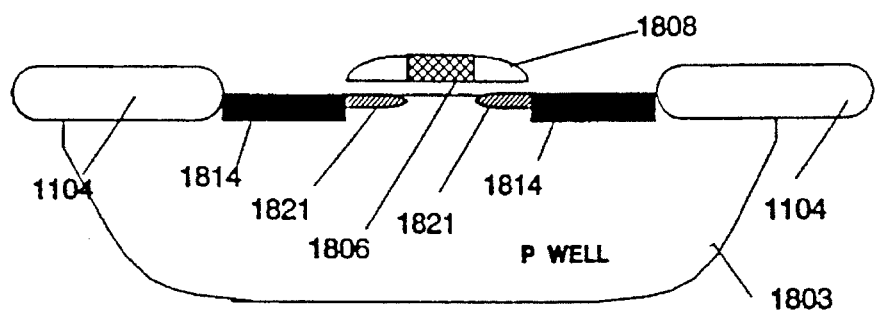
FIGS. 19A and 19B are cross-sectional views depicting in greater detail the low breakdown voltage structures fabricated in accordance with one embodiment of this invention related to FIGS. 18A through 18E.
Figure 19B:
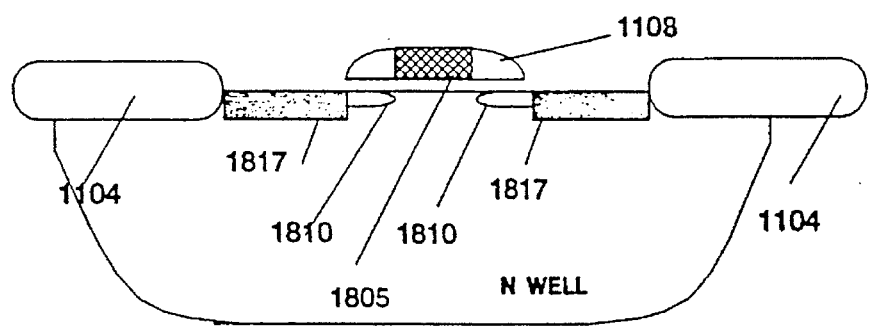

FIGS. 19A and 19B are cross-sectional views showing in greater detail the embodiment of FIGS. 18A–18E, having low breakdown voltage devices formed in P wells and N wells, respectively, in accordance with the teachings of this invention. In the embodiment shown in FIGS. 19A and 19B, the low breakdown voltage device is formed in a similar fashion as an MOS transistor including lightly doped drains, with the lightly doped drain regions being adjacent the channel region and formed to a shallower depth than the adjacent source/drain regions.

Figure 20A:
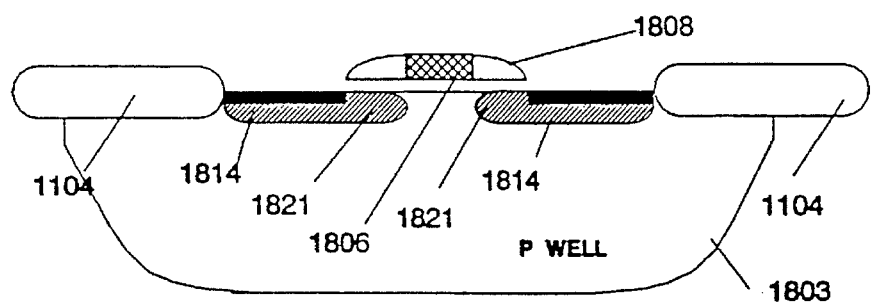
FIGS. 20A through 20B are cross-sectional views depicting in greater detail the low breakdown voltage structures fabricated in accordance with another embodiment of this invention related to FIGS. 18A through 18E.
Figure 20B:
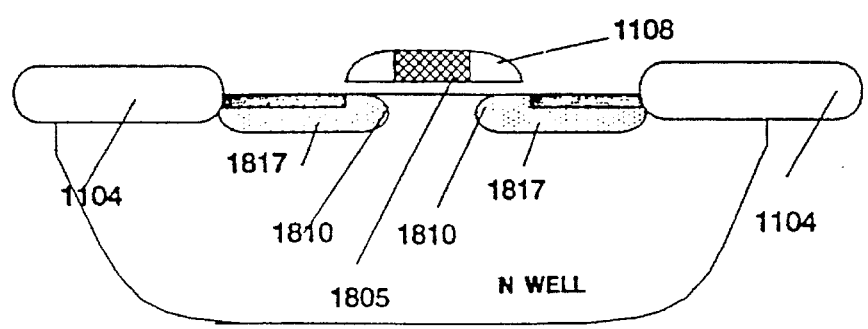

FIGS. 20A and 20B depict alternative embodiments of low breakdown voltage devices formed within P wells and N wells, respectively, in accordance with the teachings of this invention where the lightly doped regions associated with the low breakdown voltage devices are the same dopant type as their respective well regions. As shown in FIGS. 20A and 20B, low breakdown voltage devices are formed with a lightly doped drain region of the same dopant type as its well or bulk type region formed to a greater depth and in fact deeper within a substrate than their corresponding source/drain regions of opposite dopant type. In the embodiment of FIGS. 20A and 20B, a greater current density is provided by a greater spacial volume of lightly doped drain regions, thereby allowing the low breakdown voltage devices of the embodiments of FIG. 20A and 20B to reliably handle a greater amount of current. In one embodiment of this invention, the lightly doped drain regions are driven to the appropriate depth for all similarly formed lightly doped drain transistors and low breakdown voltage devices, without adversely affecting the performance of LDD transistors which serve as normal CMOS transistors on the integrated circuit, since the lightly doped drain defines the junction of its associated transistor, meaning that the depth of the lightly doped drain is a material to the operating characteristics of the transistors, except for an increased current carrying capacity with increased lightly doped drain junction depth. In one embodiment of this invention in which the lightly doped-drain regions are formed to a greater depth than their associated source drain regions (as in the embodiment of FIGS. 20A and 20B), the lightly doped drain regions are formed to a depth of approximately 1 micron, and the source/drain regions are formed to a depth of approximately 0.3 micron, although any suitable depths for these regions can be used. Similarly, in one embodiment of this invention in which the lightly doped drain regions are formed to a shallower depth than their associated source/drain regions (as in the embodiment of FIGS. 19A and 19B), the lightly doped drain regions are formed to a depth of approximately 0.5 micron, and the source/drain regions are formed to a depth of approximately 1 micron, although any suitable depths for these regions can be used. In one embodiment, for convenience, the desired junction depth of the source/drain regions with respect to the lightly doped drain regions is achieved by varying the drive times associated with those regions, with the same amount of dopant being implanted into those regions for each of these alternative embodiments.

Figure 21A:
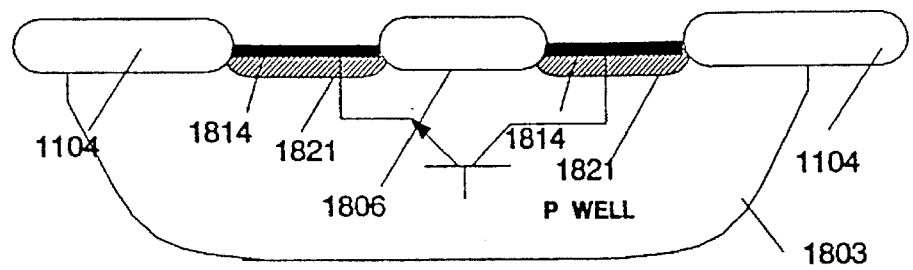
FIGS. 21A and 21B depict alternative embodiments, generally similar to the embodiments of FIGS. 20A and 20B, respectively.
Figure 21B:
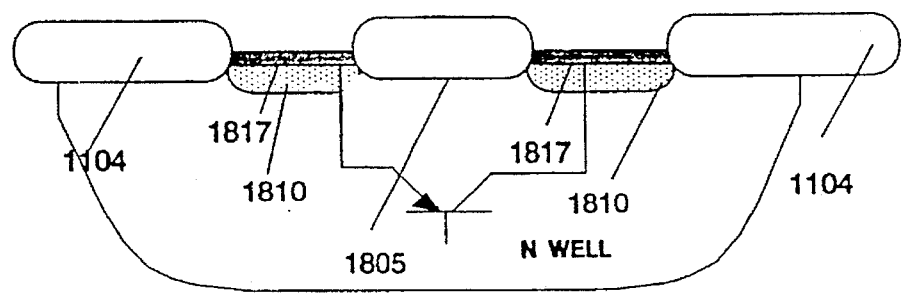

FIGS. 21A and 21B depict alternative embodiments of this invention, in which the low breakdown voltage devices are formed as source/drain regions including a lightly doped drain region of opposite dopant type as source/drain regions, of about the same area as the source/drain region and driven to a deeper junction depth. As shown in the embodiments of FIGS. 21A and 21B, the "channel" can be covered with field oxide, since in this embodiment gate oxide sidewall spacers are not used as a mask when forming the source/drain regions and lightly doped drain regions. Alternatively, the "channel" can be formed in a conventional fashion, including a gate electrode with or without sidewall spacers, as has been previously described.

Figure 22A:
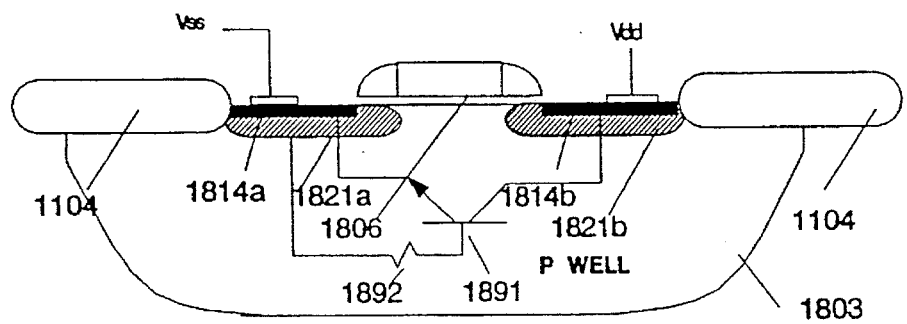
FIG. 22A depicts the electrical operation embodiment of a low breakdown voltage structure constructed in accordance with the teachings of this invention.
Figure 22B:
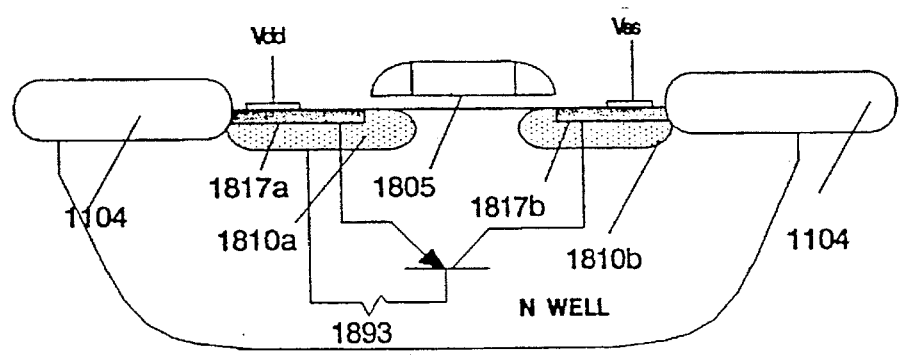
FIG. 22B depicts the electrical operation of one embodiment of a low breakdown voltage structure constructed in accordance with the teachings of this invention.

FIGS. 22A and 22B depict the electrical function of the various components of a low breakdown voltage protection device formed in accordance with the teachings of this invention, specifically the embodiments of FIGS. 20A and 20B, respectively. As shown in FIG. 22A, a low breakdown voltage device is formed within P well 1803 when substrate 1801 is an N type substrate. In this embodiment, the low Breakdown voltage device is contained in an active region surrounded by field oxide 1104. The low breakdown voltage device includes source/drain regions 1814a and 1814b, and associated lightly doped drain regions 1821a and 1821b, respectively. In this example, gate electrode 1806 is tied to P well 1803, or any other convenient voltage. However, is to be understood as previously mentioned that these gate electrodes do not serve to control the operation of the MOS transistor structure thus formed, since the doping level in the channel prevents it from inverting. Thus, these gate electrodes can in fact be removed, if desired, or used as a first layer of polycrystalline silicon interconnect. In this example, source region 1814a is tied to a low voltage Vlow, for example approximately 0 volts, available from VSS and which serves to bias P well 1803. Drain region 1814b is tied to a positive voltage V+, such as VDD. The low breakdown voltage device is formed by a parasitic NPN transistor 1891 with its collector being formed by N+ drain region 1814a, its emitter being formed N+ drain region 1814b, and its base formed by P well 1803 and lightly doped drain P regions 1821a and 1821b (if present, as these lightly doped regions are optional). The base of parasitic NPN transistor 1891 is tied through base resistance 1892 formed by the inherent resistivity of P well 1803 (and lightly doped regions 1821a, if present, as it is optional) to source region 1814a. It is the relative doping levels of regions 1821b and 1814b which determine the breakdown characteristics of parasitic NPN transistor 1891. During an ESD occurrence, the action of the parasitic NPN transistor 1891 is that collector/base junction 1814b/1821b breaks down and a flood of carriers, if sufficiently large, turns on parasitic bipolar transistor 1891, causing the emitter and collector junctions to go into conduction. This causes parasitic bipolar transistor 1891 to exhibit negative resistance if the current through the space charge region is sufficiently large to sustain impact ionization multiplication current.

In the event there is not sufficient gain to cause the parasitic bipolar transistor to turn on, device breakdown will still occur between the lightly doped drain region its associated source/drain region. In this event, the IV curve is as shown in FIG. 23B, for an exemplary parasitic lateral PNP transistor.

Figure 23A:
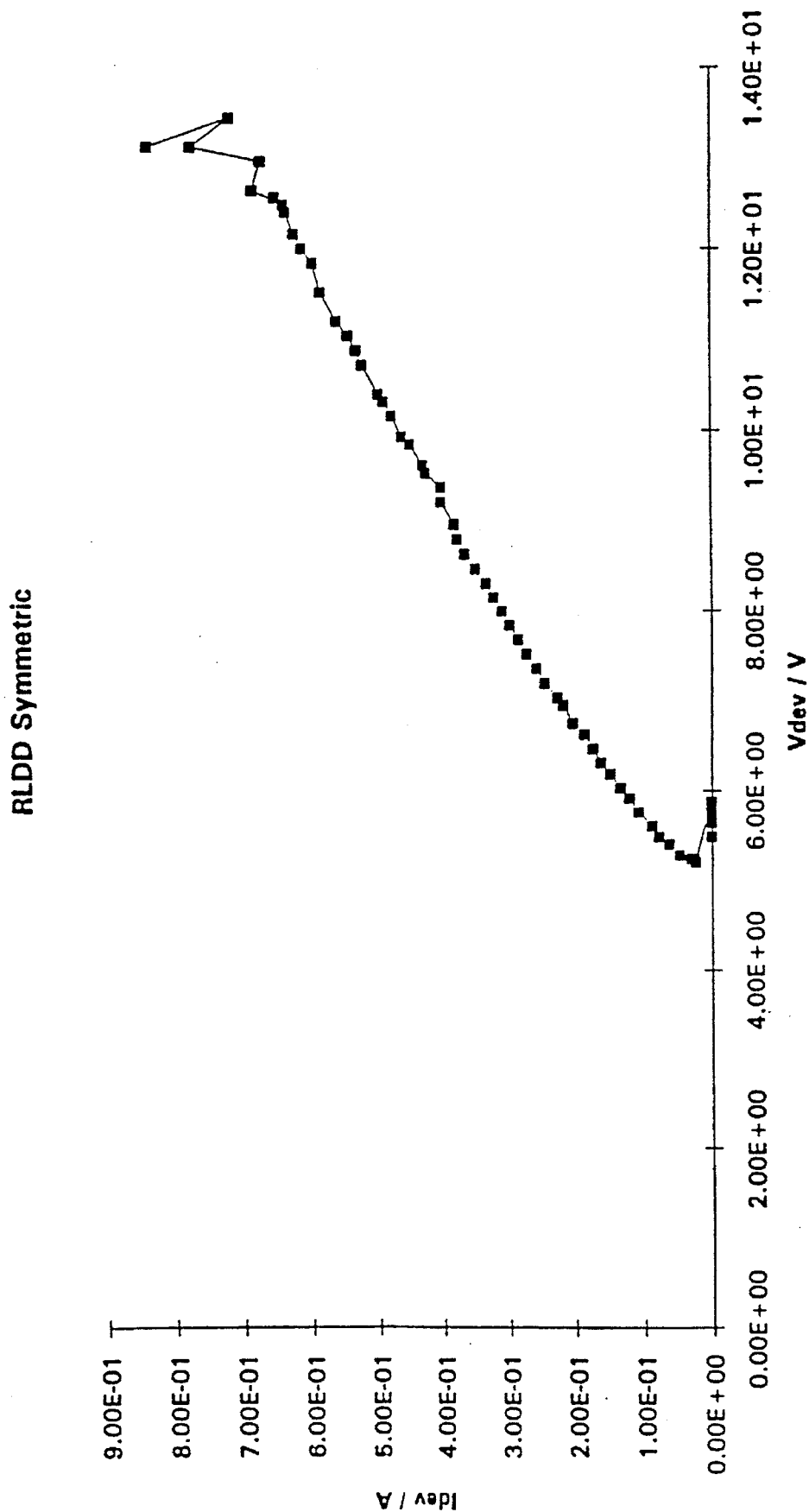
FIGS. 23A and 23B are curves depicting test results of low breakdown voltage devices constructed in accordance with the embodiments of FIGS. 20A and 20B, respectively.
Figure 23B:
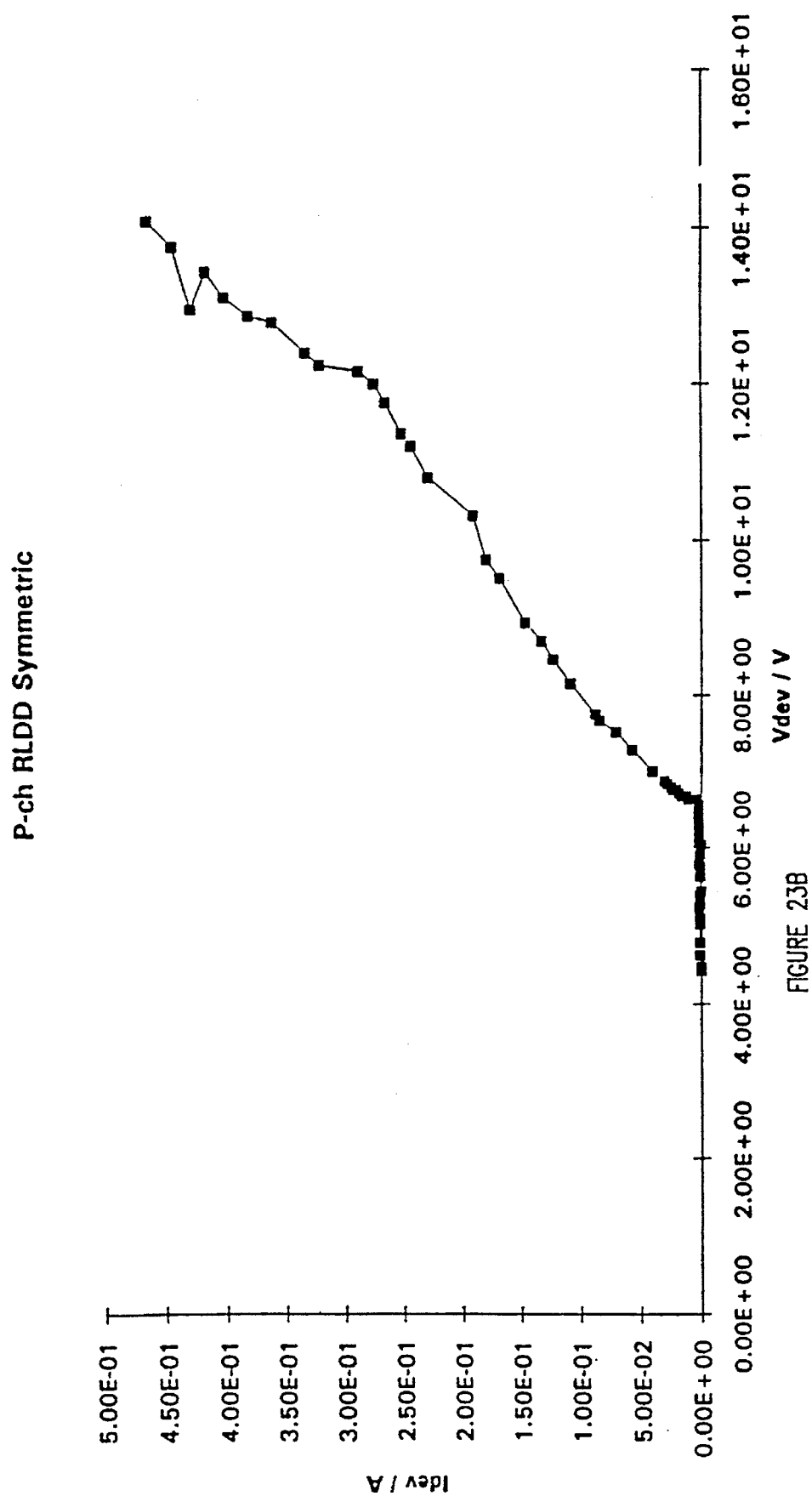

FIGS. 23A and 23B are curves depicting test results of low breakdown voltage devices constructed in accordance with the embodiments of FIGS. 20A and 20B, respectively. As shown in FIGS. 23A and 23B, the low breakdown voltage devices of this embodiment begin breakdown at about 6 volts, with an on resistance of about 11 ohms. Also, FIG. 23A shows a negative resistance characteristic associated with the parasitic NPN low breakdown voltage device (also shown in FIG. 22A), while the curve of FIG. 22B shows no negative resistance associated with this test example of a parasitic PNP device of FIG. 20B (also shown in FIG. 22B), because this exemplary parasitic PNP device does not have sufficient gain to exhibit transistor negative resistance.

Figure 24A:
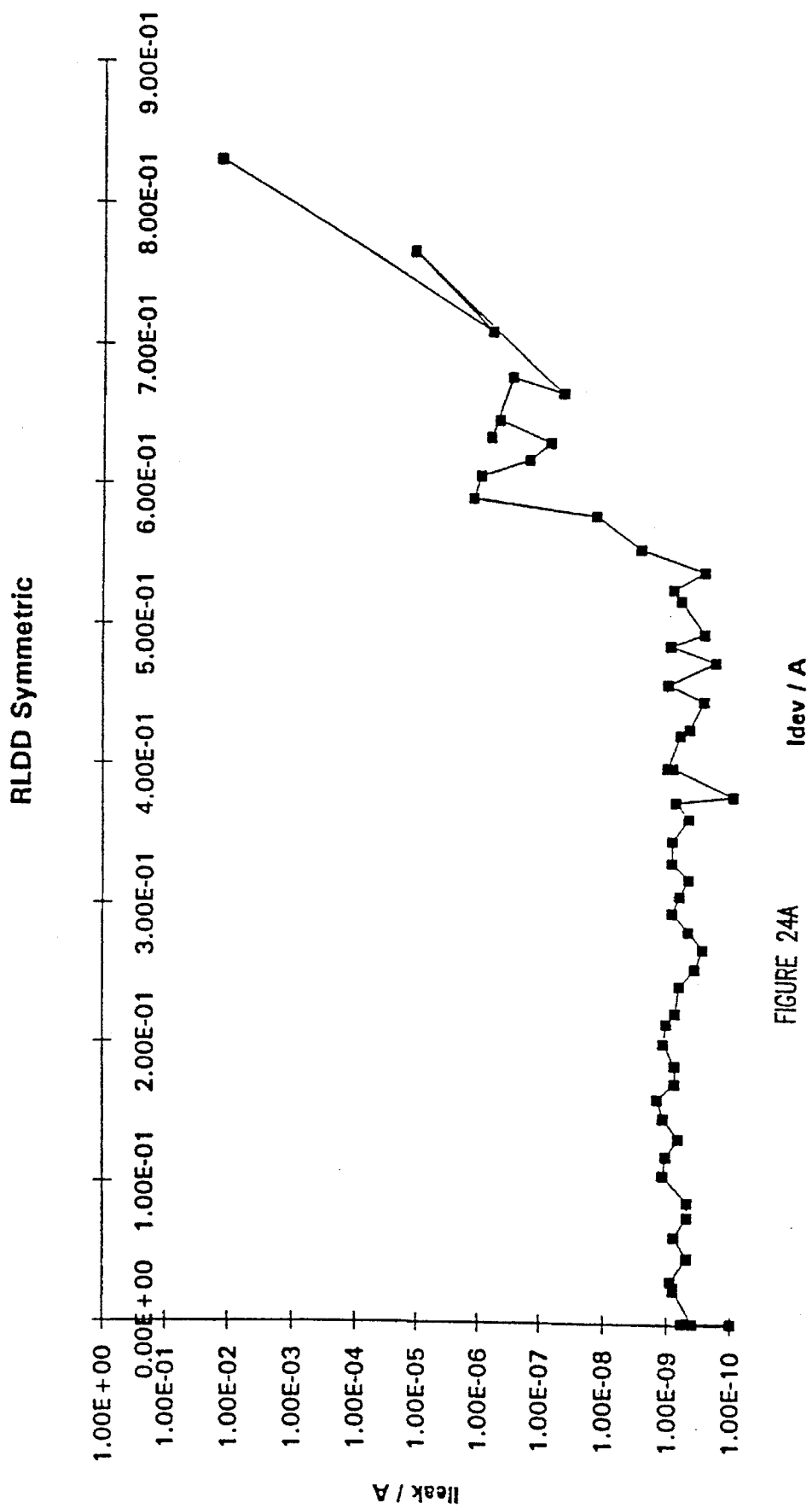
FIGS. 24A and 24B are curves depicting the leakage current verses substrate leakage for the exemplary devices constructed in accordance with the embodiments of FIGS. 20A and 20B, respectively.
Figure 24B:
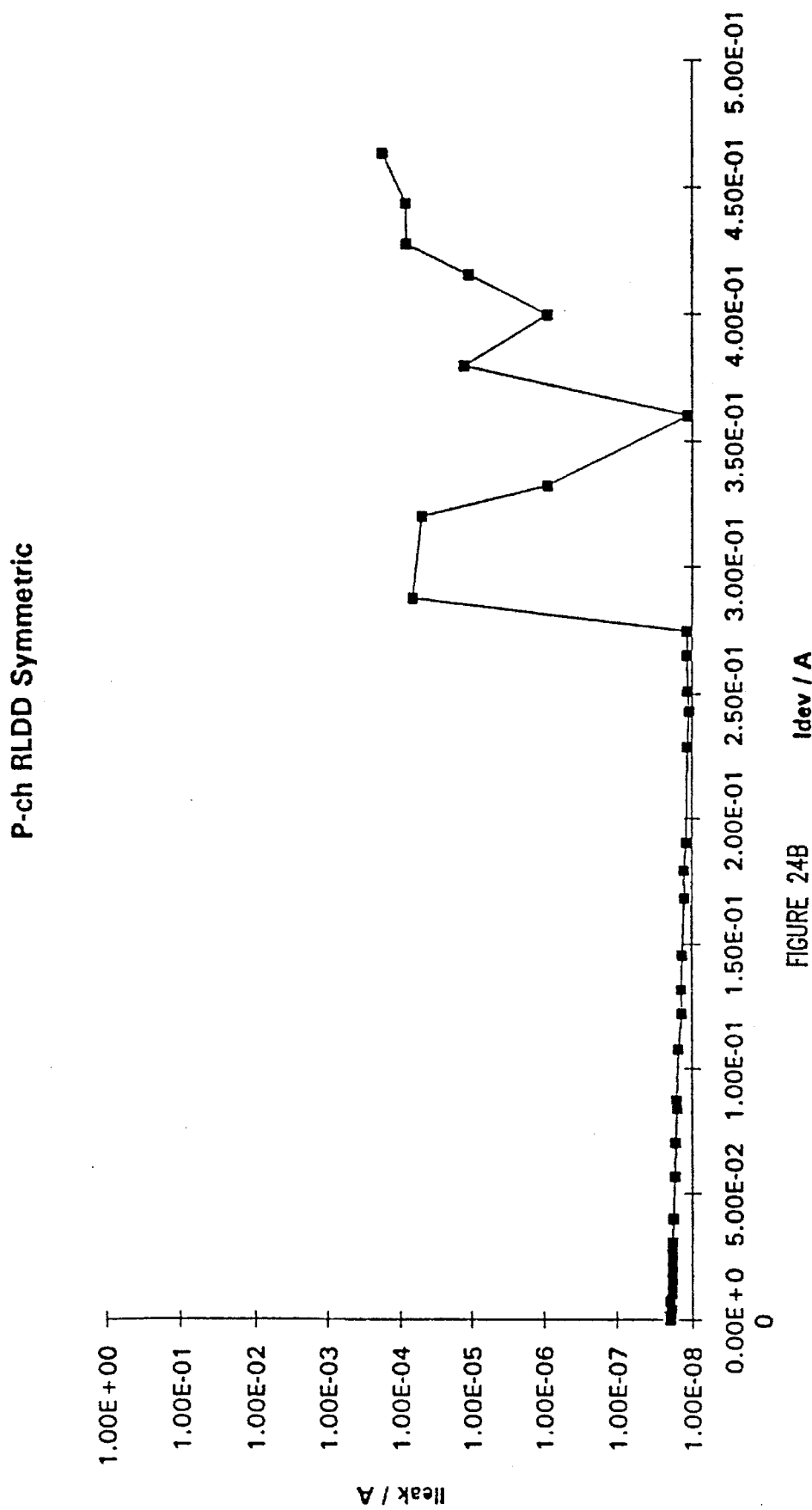

FIGS. 24A and 24B are curves depicting the leakage current for exemplary devices constructed in accordance with FIGS. 20A and 20B, respectively. As shown in FIGS. 24A and 24B, for a channel width of approximately 50 microns, substrate current leakage begins at approximately 500 milliamp total current, or approximately 10 milliamp/micron, where the substrate leakage current starts to deteriorate.

The curves of FIGS. 23A, 23B, 24A, and 24B have been generated using transmission line techniques, such as is described by Malone and Khurana, "Transmission Line Pulsing Techniques for Circuit Modeling of ESD Phenomena", Proceeding of the EOS/ESD Symposium 1985, (pages 49–54).

Figure 25A:
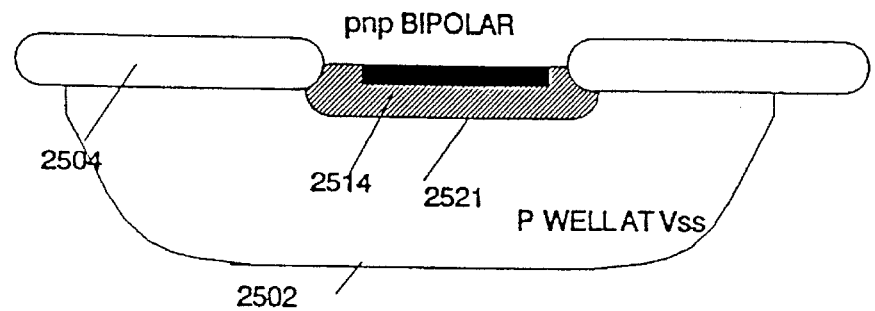
FIGS. 25A and 25B are cross sectional views of novel ESD protection structures of this invention formed as vertical PNP and NPN transistors, respectively.
Figure 25B:
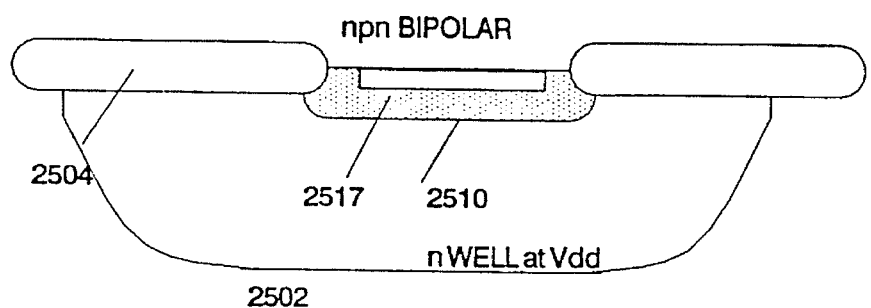

FIGS. 25A and 25B are cross-sectional views of novel ESD protection structures of this invention which are formed as vertical PNP and NPN transistors within P well 2503 and N well 2502, respectively. Referring to FIG. 25A, a vertical PNP transistor is constructed to provide an ESD protection device in accordance with the teachings of this invention, including P+ emitter region 2514, which can be formed at the same time as P+ source/drain regions elsewhere in the integrated circuit, and N type lightly doped drain base 2521, which can be formed simultaneously with the formation of other lightly doped drain N type regions within the same integrated circuit, although in accordance with this invention these LDD regions are of opposite dopant type as their respective well regions, in contrast to standard MOS devices in which the LDD doping is of the same type as their respective well regions. Emitter 2514 and base 2521 are formed within P well 2503, which serves as the collector of the vertical NPN transistor. Similarly, as shown in FIG. 25B, a vertical NPN transistor is constructed to provide an ESD protection device, including N+ emitter region 2517, which can be formed at the same time as N+ source/drain regions elsewhere in the integrated circuit, and P type lightly doped drain base 2510, which can be formed simultaneously with the formation of other lightly doped drain P type regions within the same integrated circuit. Emitter 2517 and base 2510 are formed within N well 2502, which serves as the collector of the vertical NPN transistor.

Figure 25C:
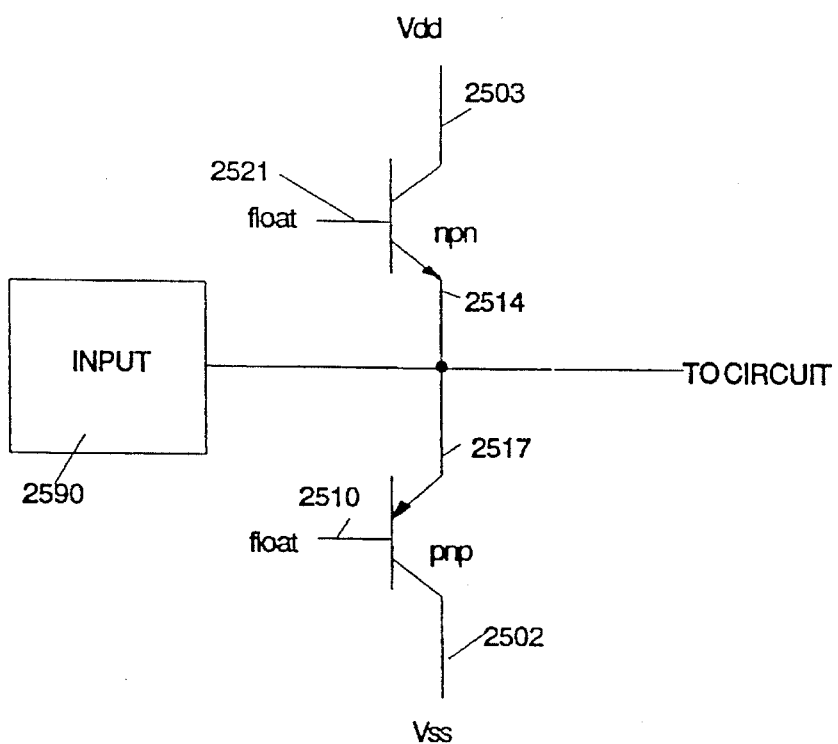
FIG. 25C is a schematic diagram depicting the use of the structures of FIGS. 25A and 25B as input protection devices.

FIG. 25C shows one example of the vertical NPN and PNP transistors of FIGS. 25A and 25B, respectively, connected to an input pad 2590 to provide both positive and negative ESD protection. In FIG. 25A, P well 2503 is typically connected to the positive supply voltage VDD, and in the structure of FIG. 25B, N well 2502 is typically connected to the negative supply voltage VSS. In accordance with this embodiment, the vertical bipolar transistors provide greater gain and thus lower on resistance than comparably formed lateral bipolar transistors. Furthermore, the vertical bipolar transistors of this invention can be made to have lower punchthrough voltages than the lateral bipolar transistors previously described.

Figure 26A:
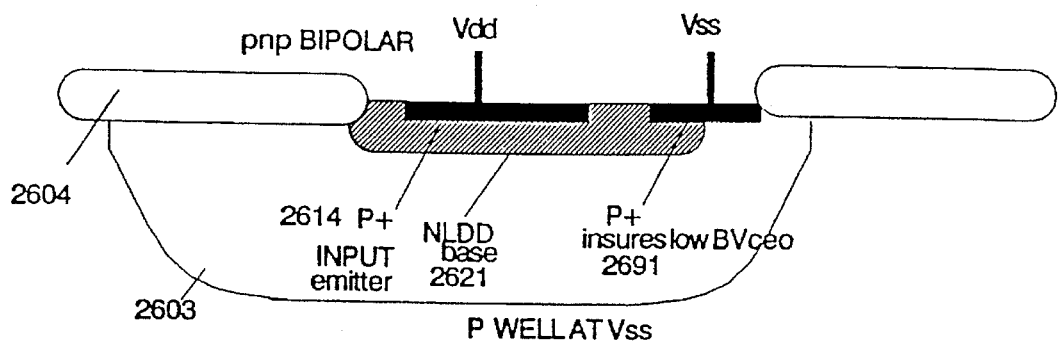
FIGS. 26A and 26B depict alternative embodiments of vertical bipolar transistors constructed in accordance with the teachings of this invention.
Figure 26B:
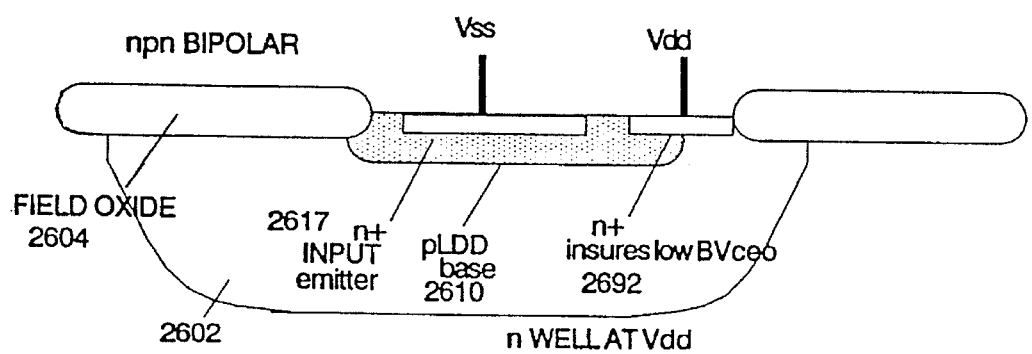

FIGS. 26A and 26B depict alternative embodiments of vertical bipolar transistors which serve as low breakdown voltage devices in accordance with the teachings of this invention. Referring to FIG. 26A, a vertical PNP transistor is constructed to provide a low collector/base breakdown voltage device in accordance with the teachings of this invention, including P+ emitter region 2614, which can be formed at the same time as P+ source/drain regions elsewhere in the integrated circuit, and N type lightly doped drain base 2621, which can be formed simultaneously with the formation of other lightly doped drain N type regions within the same integrated circuit. Emitter 2614 and base 2621 are formed within P well 2603, which serves as the collector of the vertical PNP transistor. In the embodiment of FIG. 26A, P+ contact region 2691 is formed bridging N type lightly doped drain region 2621 and P well 2603. P+ contact region 2691 is tied to VSS, for example, in order to ensure a low breakdown voltage $BV_{CEO}$ because of the high dopant concentrations of the P+ and N type LDD regions which are in contact with each other. This initiates the breakdown at a low voltage. Similarly, as shown in FIG. 26B, a vertical NPN transistor is constructed to provide a low breakdown voltage device in accordance with the teachings of this invention, including N+ emitter region 2617, which can be formed at the same time as N+ source/drain regions elsewhere in the integrated circuit, and P type lightly doped drain base 2610, which can be formed simultaneously with the formation of other lightly doped drain P type regions within the same integrated circuit. Emitter 2617 and base 2610 are formed within N well 2602, which serves as the collector of the vertical NPN transistor. In FIG. 26A, P well 2603 is typically connected, via P+ contact region 2692, to the positive supply voltage VDD, and in the structure of FIG. 26B, N well 2602 is typically connected, via N+ contact region 2692, to the negative supply voltage VSS.

Figure 26C:
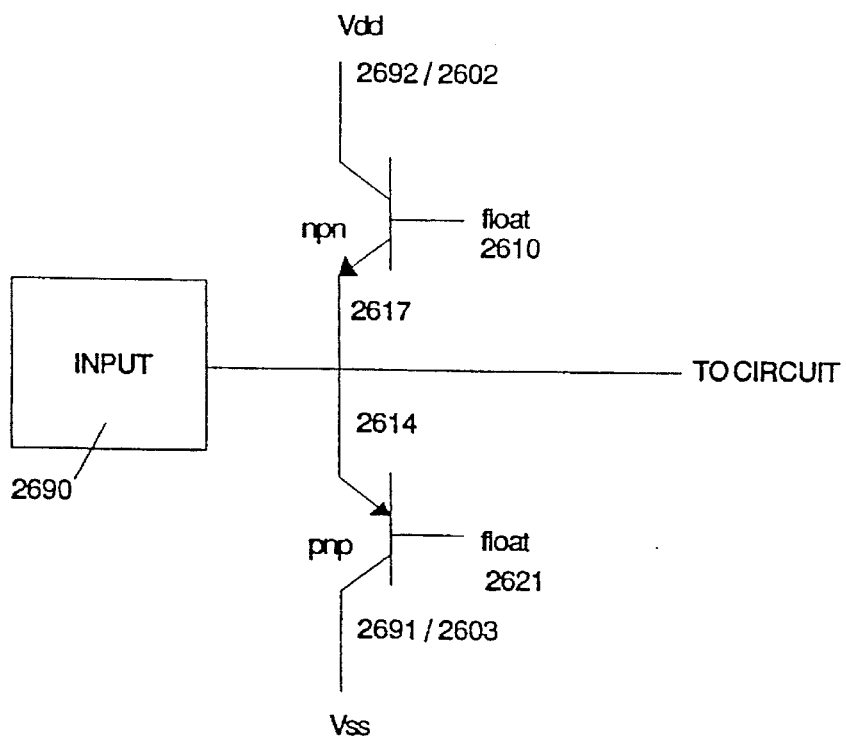
FIG. 26C is a schematic diagram depicting the use of the structures of FIGS. 26A and 26B as input protection devices.

FIG. 26C shows one example of the vertical NPN and PNP transistors of FIGS. 26A and 26B, respectively, connected to an input pad 2690 to provide both positive and negative ESD protection. In FIG. 26A, P well 2603 is typically connected to the positive supply voltage VDD, and in the structure of FIG. 26B, N well 2602 is typically connected to the negative supply voltage VSS. As with the embodiment of FIGS. 26A and 26B, the vertical bipolar transistors provide greater gain and thus lower on resistance than comparably formed lateral bipolar transistors. Furthermore, the vertical bipolar transistors of this invention can be made to have lower punchthrough voltages than the lateral bipolar transistors previously described.

Figure 27A:
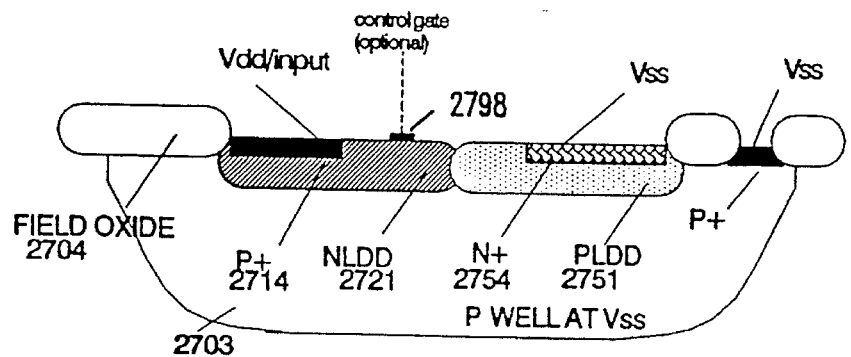
FIGS. 27A and 27B are alternative embodiments of this invention which form SCR structures having low breakdown voltage characteristics.
Figure 27B:
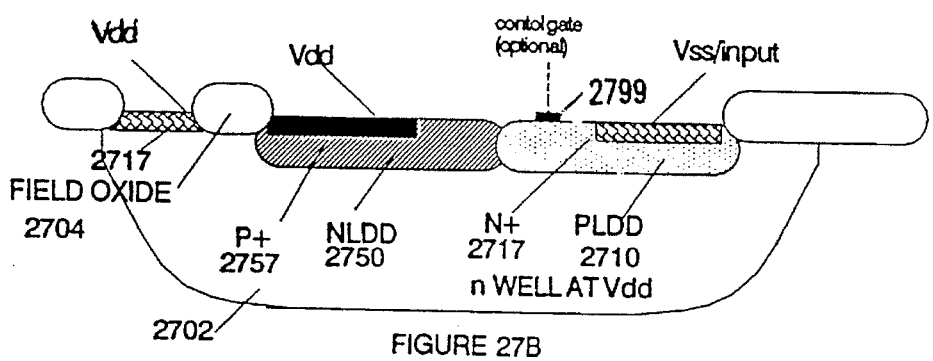

FIGS. 27A and 27B are cross-sectional views of silicon control rectifier (SCR) structures constructed in accordance with the teachings of this invention in order to provide low breakdown voltage devices. As shown in FIG. 27A, within P well 2703 is formed P+ emitter region 2714 and N type lightly doped drain base region 2721, thereby forming a vertical PNP transistor, with P well 2703 serving as the collector. Also formed within P well 2703 is vertical NPN transistor including N+ emitter 2754 and P type lightly doped drain base region 2751, thus forming a vertical NPN transistor, with P well 2721 serving as the collector. Similarly, as shown in FIG. 27B, within N well 2702 is formed P+ emitter region 2757 and N type lightly doped drain base region 2750, thereby forming a vertical NPN transistor with N well 2702 serving as the collector. Also formed within N well 2702 is vertical NPN transistor including N+ emitter 2717 and P type lightly doped drain base region 2710, thus forming a vertical NPN transistor with P well 2702 serving as the collector.

Figure 27C:
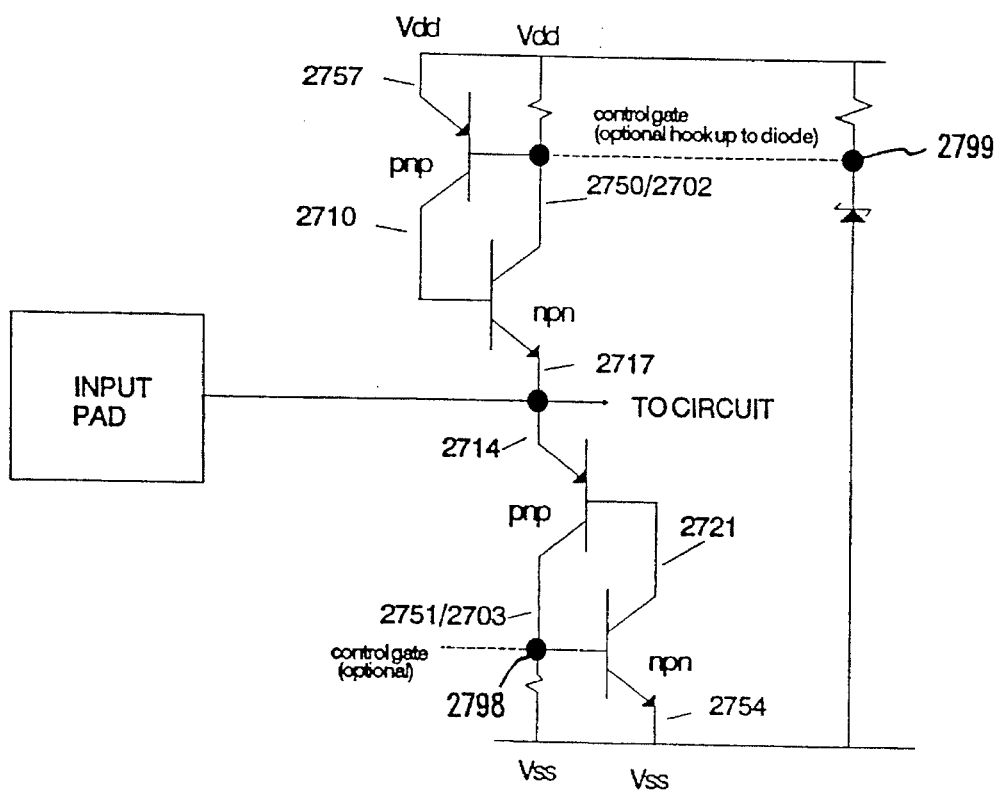
FIG. 27C is a schematic diagram depicting how the structures of FIGS. 27A and 27B can be used as input protection devices.

FIG. 27C depicts the SCR structures of FIGS. 27A and 27B connected to an input pad 2790 to serve as both positive and negative going ESD protection. However, it is to be understood that either one of these SCR structures can be used alone in this regard. Typically, P well 2703 is tied to VSS and N well 2702 is tied to VDD.

Also shown in FIGS. 27A and 27B are optional control gates 2798 and 2799, respectively, which as shown in FIG. 27C are tied to VSS and VDD, respectively, through a resistance (not shown in FIGS. 27A and 27B). When used, control gates 2798 and 2799 serve to assist in the turn on of the SCR structures at a lower voltage than their normal turn on voltage.

Figure 28A:
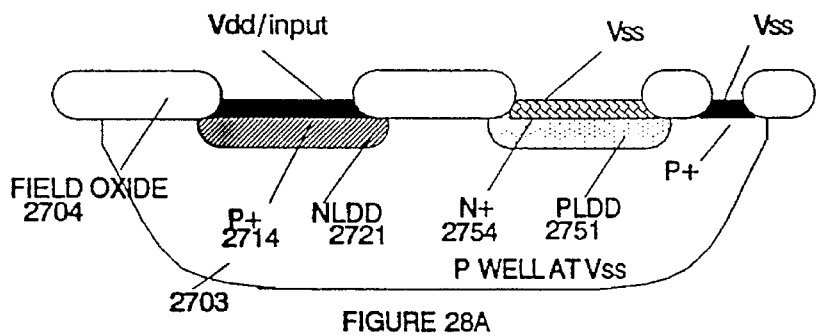
FIGS. 28A and 28B are cross sectional views depicting alternative embodiments of this invention.
Figure 28B:
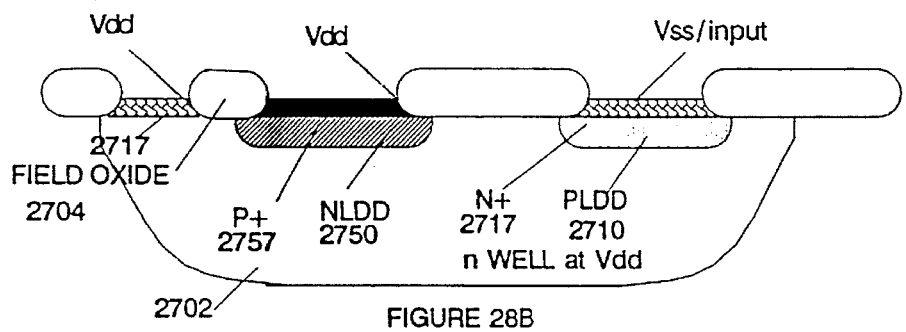

FIGS. 28A and 28B show alternative embodiments of SCR structures similar to those shown in the embodiments of FIGS. 27A and 27B, respectively. As shown in FIG. 28A, the vertical PNP and vertical NPN devices are separated by a portion of field oxide layer 2704. This has the advantage of no polycrystalline silicon and no thin oxide in the area where low voltage breakdown is to occur. Also, as shown in the embodiments of FIGS. 28A and 28B, each vertical bipolar transistor is made smaller in that the lightly doped drain portion is not larger than the more heavily doped portion.

Figure 29A:
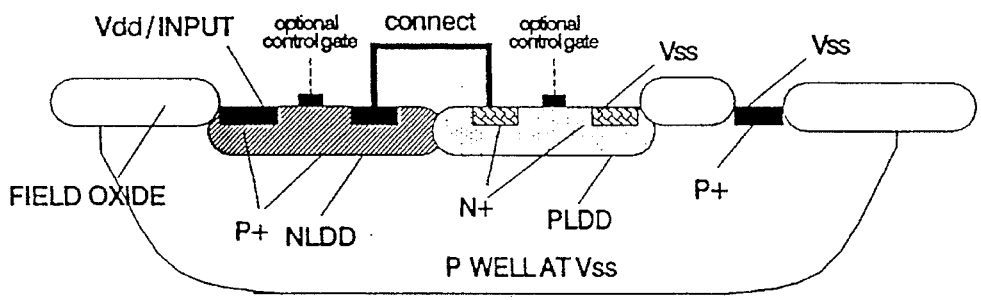
FIGS. 29A and 29B are cross sectional views depicting alternative embodiments of this invention including an electrical interconnect for tying together selected regions.
Figure 29B:
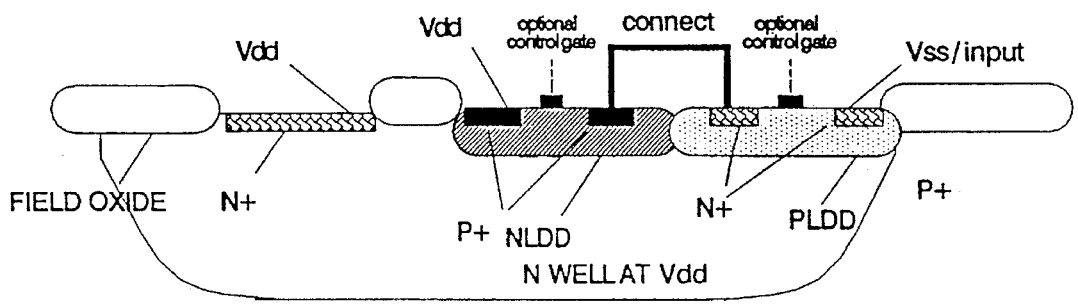

FIGS. 29A and 29B are alternative embodiments of the SCR structures, similar to those of FIGS. 27A and 27B, respectively. However, in the embodiments of FIGS. 29A and 29B, an electrical interconnection is made between the N type and P type lightly doped drain regions in order to insure the low breakdown voltage transistors are interconnected to form an SCR structure. Alternatively, the NPN and PNP vertical transistors can be separated by a portion of the field oxide layer, as described previously and shown in the embodiment of FIGS. 28A and 28B, with the electrical interconnect being formed as shown in the embodiment of FIGS. 29A and 29B. Also shown in FIGS. 29A and 29B are optional control gates which serve in a similar fashion as has been described with respect to the optional control gates of FIGS. 27A through 27C.

Figure 30A:
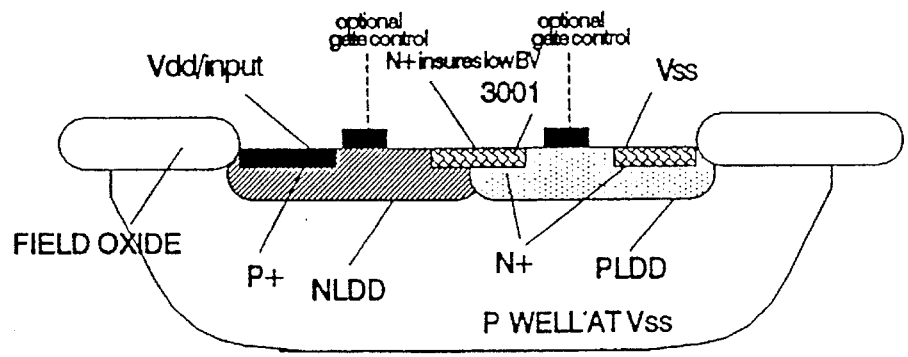
FIGS. 30A and 30B are cross sectional views of alternative embodiments of this invention including a doped region for tying together selected regions of the structure.
Figure 30B:
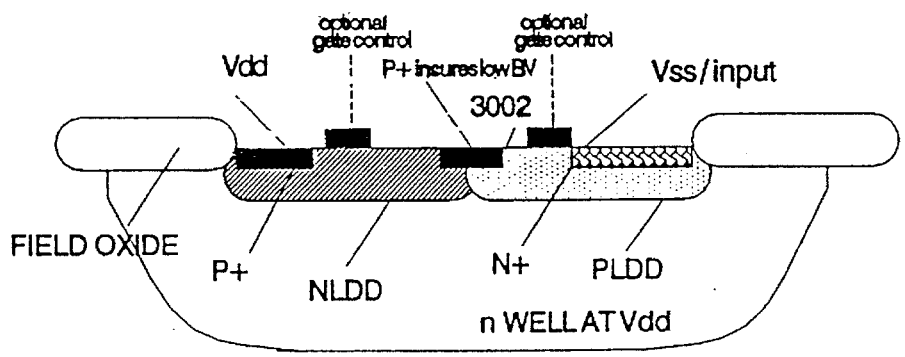
Figure 31A:
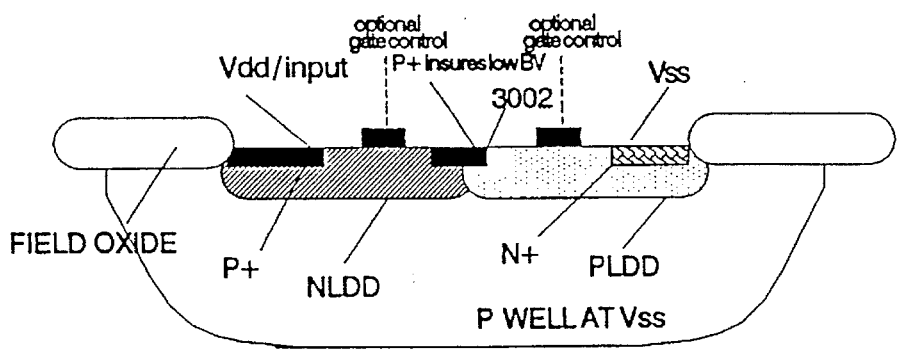
FIGS. 31A and 31B are alternative embodiments of this invention including a doped region for tying together selected regions of the structure.
Figure 31B:
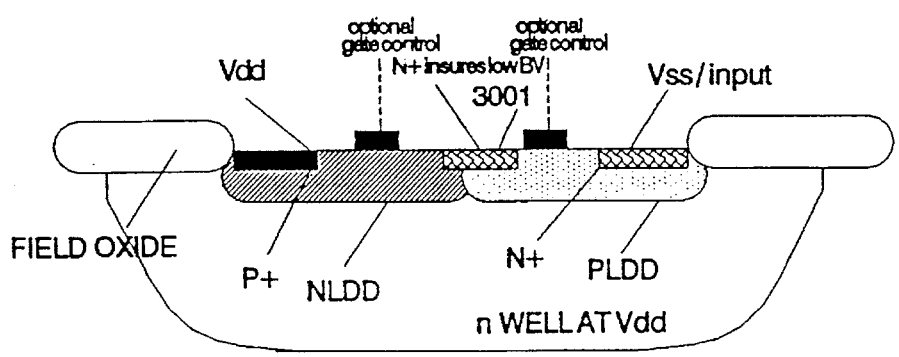

The embodiments of FIGS. 30A and 30B are similar to the embodiments of FIGS. 29A and 29B, respectively, but include a doped region bridging the N type and P type lightly doped drain regions in order to ensure a low breakdown voltage. In the embodiments of FIGS. 30A and 31B, an N+ region 3001 is used within a P well and an N well, respectively, to ensure low breakdown voltage. In the embodiments of FIGS. 30B and 31A, a P+ region 3002 is used within an N well and a P well, respectively, to ensure low breakdown voltage. Also shown in FIGS. 30A, 30B, 31A, and 31B are optional control gates which, if used, serve in a similar fashion as the optional control gates of FIGS. 29A through 29C, previously described.

Figure 32:
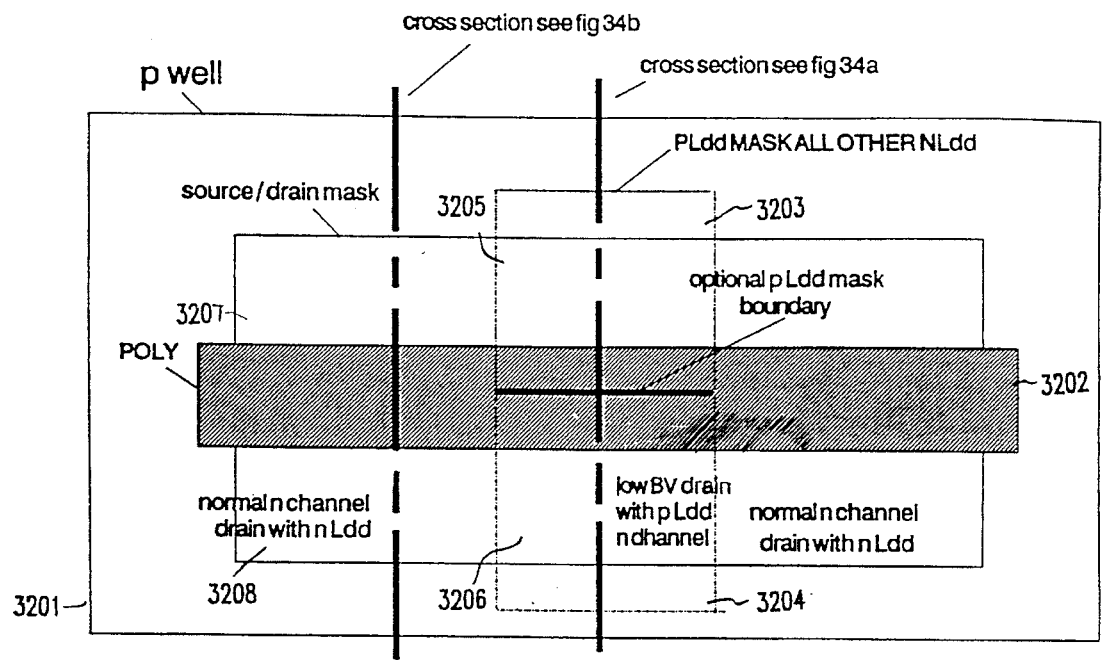
FIG. 32 is a plan view of a device constructed within a P well in accordance with this invention, which includes a low breakdown voltage device integrated with a standard MOS transistor.
Figure 33:
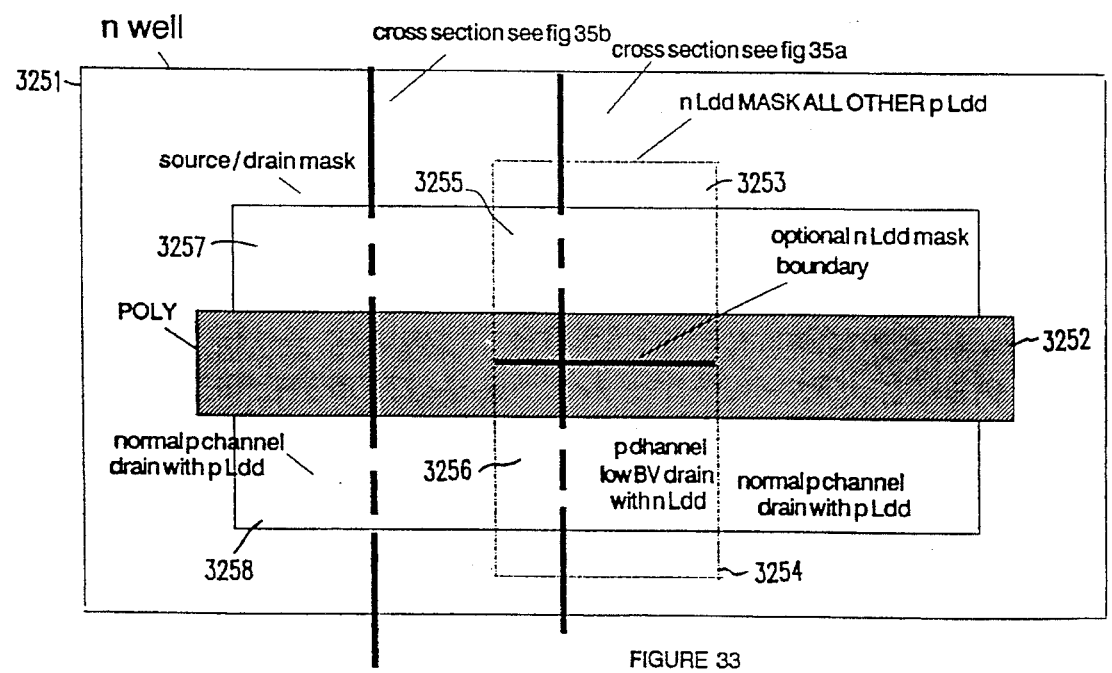
FIG. 33 is a plan view of a device constructed within an N well in accordance with this invention, which includes a low breakdown device integrated with a standard MOS transistor.
Figure 36A:
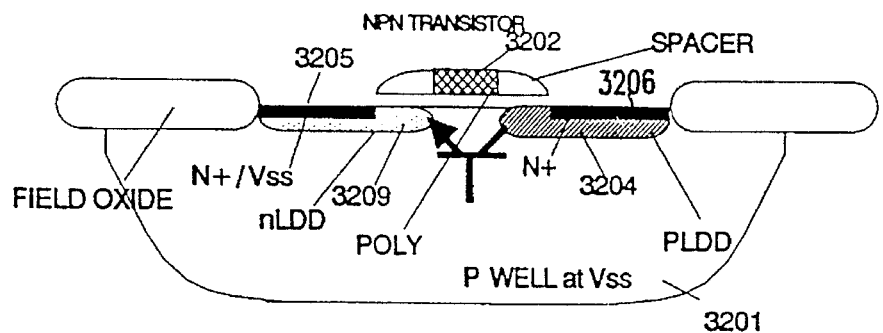
FIGS. 36a, 36b, 37a, and 37b depict embodiment similar to FIGS. 34a, 34b, 35a, 35b, respectively, but without blanket LLD implants.
Figure 36B:
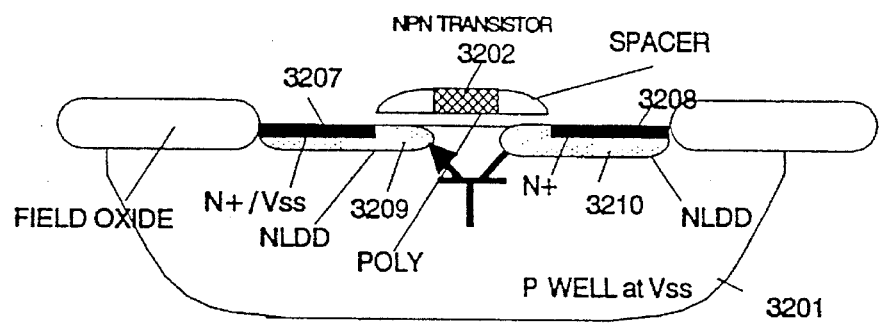
Figure 37A:
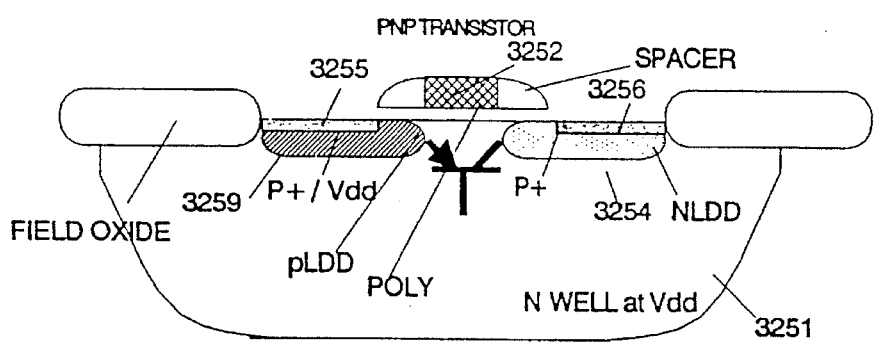
Figure 37B:
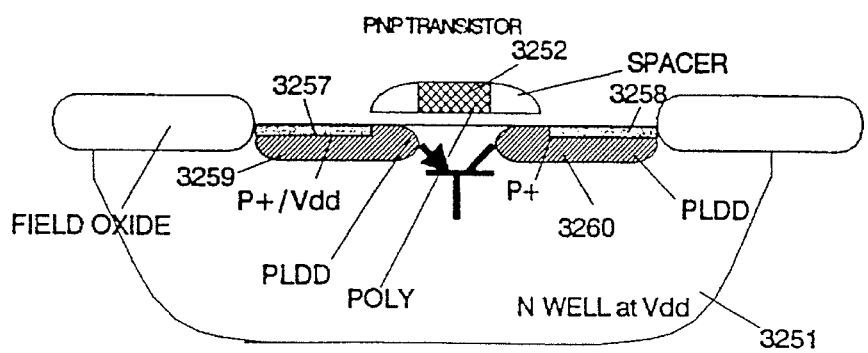

FIGS. 32 and 33 are plan views of P well and N well versions, respectively, of one embodiment of this invention wherein a low breakdown voltage device is formed integrated with a typical prior art MOS transistor. These embodiments allow the low breakdown structures of this invention to trigger the turn on of a larger parasitic bipolar transistor of a standard MOS device, thereby providing greater current carrying capacity to be turned on at a low voltage without significant increase in circuit area. This novel method and structure allows a very high current capacity low breakdown voltage device which is triggered by a low breakdown device of this invention and which has current carrying capacity of any desired amount based upon the sizing of the integrated standard MOS transistor. Furthermore, this embodiment provides high current transistors suitable for use as output transistors in integrated circuits, which are effectively ESD protected by the integrated low breakdown voltage triggering device.

As shown in FIG. 32, within P well 3201 is formed a blanket N type lightly doped implant, which will remain unaffected by other dopings to form N type lightly doped drain regions 3209 and 3210 (FIG. 34B) of the normal N channel transistor formed within P well 3201. Also forming the normal N channel transistor shown in the plan view of FIG. 32 and in cross section in FIG. 34B are N type source/drain regions 3207 and 3208, and polycrystalline silicon gate electrode 3202. The low breakdown device is formed integrated with the normal N channel transistor, as shown in the plan view of FIG. 32 and the corresponding cross sectional view of FIG. 34A. The low breakdown device includes P type lightly doped drain regions 3203 and 3204, and N type source/drain regions 3205 and 3206, as well as the polycrystalline silicon gate electrode 3202. While FIG. 34A shows in cross section a low breakdown voltage device similar to the embodiment of FIG. 20A, it is to be understood that any of the various embodiments of low breakdown voltage devices of this invention can be used for integration with the standard MOS transistor in order to achieve the benefits of triggering turn on of the parasitic bipolar transistor at a lower voltage established by the low breakdown voltage device. Such a low breakdown voltage triggering is shown in "ESD: A Pervasive Reliability Concern for IC Technologies", Duvvury and Amerasekera, Proceedings of the IEEE, Vol. 81, No. 5, May 1993. However, as taught by the present invention, such a low breakdown voltage triggering device is easily formed with existing process and masking steps, and integrated directly into the output stage transistors.

As show in FIG. 33, within N well 3251 is formed a blanket P type lightly doped implant, which will remain unaffected by other dopings to form P type lightly doped drain regions 3259 and 3260 (FIG. 35B) of the normal P channel transistor formed within N well 3251. Also forming the normal P channel transistor shown in the plan view of FIG. 33 and in cross section in FIG. 35B are P type source/drain regions 3257 and 3258, and polycrystalline silicon gate electrode 3252. The low breakdown device is formed integrated with the normal P channel transistor, as shown in the plan view of FIG. 33 and the corresponding cross sectional view of FIG. 35A. The low breakdown device includes N type lightly doped drain regions 3253 and 3254, and P type source/drain regions 3255 and 3256, as well as the polycrystalline silicon gate electrode 3252. While FIG. 35A shows in cross section a low breakdown voltage device similar to the embodiment of FIG. 20B, it is to be understood that any of the various embodiments of low breakdown voltage devices of this invention can be used for integration with the standard MOS transistor in order to achieve the benefits of triggering turn on of the parasitic bipolar transistor at a lower voltage established by the low breakdown voltage device.

FIGS. 36a, 36b, 37a, and 37b depict embodiments similar to FIGS. 34a, 34b, 35a, 35b, with the exception that the blanket LDD implants are not used. This has the effect that the low breakdown region only occurs on one side of the device (e.g. between regions 3206 and 3204).

Figure 38:
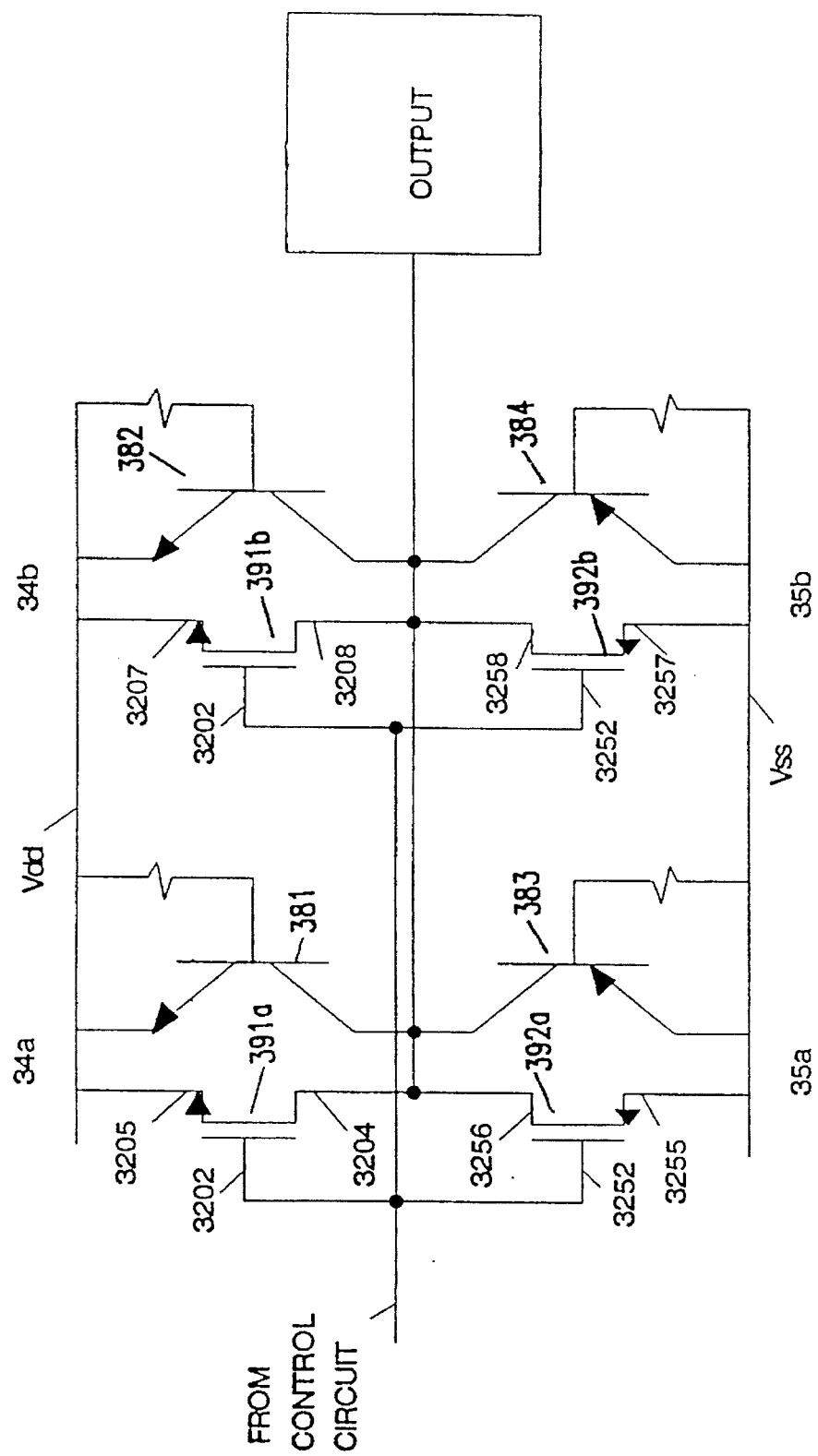
FIG. 38 is a schematic diagram of an equivalent circuit of an output buffer stage of this invention.

FIG. 38 is a schematic diagram equivalent circuit of an output buffer stage including an N channel pull up transistor 391b and low breakdown voltage device 391a, and low breakdown voltage device 392b and P channel pull down transistor 392a. Associated with N channel pull up transistor 391b is a standard parasitic NPN transistor 382, having a relatively high breakdown voltage, Associated with low breakdown voltage device 391a is low breakdown voltage parasitic NPN transistor 381, which breaks down in response to an ESD event or other overvoltage situation, thus triggering the turn on of standard parasitic NPN transistor 382 at this low voltage, providing a significant amount of current capacity at a low breakdown voltage, without a significant increase in device size.

Similarly, associated with P channel pull down transistor 392b is a standard parasitic PNP transistor 384, having a relatively high breakdown voltage. Associated with low breakdown voltage device 392a is low breakdown voltage parasitic PNP transistor 383, which breaks down in response to an ESD event or other overvoltage situation, thus triggering the turn on of standard parasitic PNP transistor 384 at this low voltage, providing a significant amount of current capacity at a low breakdown voltage, without a significant increase in device size.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A method of fabricating a semiconductor structure comprising the steps of:
    a) forming within a first bulk region of a first conductivity type, a lightly doped source/drain region of a second conductivity type opposite said first conductivity type;
    b) forming within a second bulk region of said second conductivity type, a second conductivity type lightly doped portion of a first diode region;
    c) forming within said second bulk region a lightly doped source/drain region of said first conductivity type;
    d) forming within said first bulk region a first conductivity type lightly doped portion of a first diode region;
    e) forming within said first bulk region a second conductivity type portion of said first diode region, to a junction depth not greater than the junction depth of said first conductivity type lightly doped portion of said first diode region;
    f) forming within said first bulk region a source/drain region of said second conductivity type;
    g) forming within said second bulk region a second diode region of said second conductivity type;
    h) forming within said first bulk region a second diode region of said first conductivity type;
    i) forming within said second bulk region a source/drain region of said first conductivity type; and
    j) forming within said second bulk region a first conductivity type portion of said first diode region, to a junction depth not greater than the junction depth of said first conductivity type lightly doped portion of said first diode region;
    wherein said first bulk region comprises a lightly doped source/drain MOS device and a diode having said second conductivity type portion of said first diode region formed within said first bulk region serving as a first terminal of said diode and said second diode region within said first bulk region serves as a second terminal of said diode, and
    wherein said second bulk region comprises a lightly doped source/drain MOS device and a diode having said first conductivity type portion of said first diode region within said second bulk region serving as a first terminal of said diode and said second diode region within said second bulk region serves as a second terminal of said diode.

2. A method as in claim 1, wherein steps a and b are performed simultaneously.

3. A method as in claim 2, wherein steps a and b are performed simultaneously using a blanket implant.

4. A method as in claim 1, wherein steps c and d are performed simultaneously.

5. A method as in claim 1, wherein steps e, f, and g are performed simultaneously.

6. A method as in claim 1, wherein steps h, i, and j are performed simultaneously.

7. A method as in claim 1, wherein one or both of said steps of forming within said bulk region said lightly doped source/drain regions utilizes gate electrodes as a portion of a mask and wherein said steps of forming within said bulk regions said source/drain regions utilize gate electrode sidewall spacers as a portion of a mask, thereby providing said source/drain regions laterally spaced apart from said gate electrode by a lightly doped source/drain region.

8. A method as in claim 3, wherein regions implanted by said blanket implant are over compensated in subsequent doping steps of opposite conductivity type.

9. A method of fabricating a semiconductor structure comprising the steps of:
    a) forming within a first bulk region of a first conductivity type, a lightly doped source/drain region of a second conductivity type opposite said first conductivity type;
    b) forming within one or more second bulk regions of said second conductivity type, a second conductivity type lightly doped portion of a first diode region;
    c) forming within said first bulk region a source/drain region of said second conductivity type;
    d) forming within said second bulk region a second diode region of said second conductivity type;
    e) forming within said second bulk regions a source/drain region of said first conductivity type; and
    f) forming within said second bulk regions a first conductivity type portion of said first diode region, to a junction depth not greater than the junction depth of said, second conductivity type lightly doped portion of said first diode region,
    wherein said first bulk regions comprise a lightly doped source/drain MOS device, and
    wherein said second bulk regions comprise a MOS device and a diode having said first conductivity type portion of said first diode region within said second bulk regions serving as a first terminal of said diode and said second diode region within said second bulk regions serve as a second terminal of said diode.

10. A method as in claim 9, wherein steps a and b are performed simultaneously.

11. A method as in claim 10, wherein steps a and b are performed simultaneously using a blanket implant.

12. A method as in claim 9, wherein steps c and d are performed simultaneously.

13. A method as in claim 9, wherein steps e and f are performed simultaneously.

14. A method as in claim 9, which further comprises the step of forming within said second bulk regions a lightly doped source/drain region of said first conductivity type.

15. A method as in claim 14, wherein one or both of said steps of forming within said bulk regions said lightly doped source/drain regions utilizes gate electrodes as a portion of a mask and wherein said steps of forming within said bulk regions said source/drain regions utilize gate electrode sidewall spacers as a portion of a mask, thereby providing said source/drain regions laterally spaced apart from said gate electrode by a lightly doped source/drain region.

16. A method as in claim 14, wherein regions implanted by said blanket implant are over compensated in subsequent doping steps of opposite conductivity type.

17. A method as in claim 9 which further comprises the step of forming within said first bulk region a first conductivity type well contact.

18. A method as in claim 17 wherein said step of forming said first conductivity well contact is performed simultaneously with said step of forming said source/drain region within said second bulk regions.

19. A method of fabricating a semiconductor structure comprising the steps of:
    a) forming within a first bulk region of a first conductivity type, a lightly doped source/drain region of a second conductivity type opposite said first conductivity type;
    b) forming within a second bulk region of said second conductivity type, a second conductivity type lightly doped portion of a first low breakdown voltage device;
    c) forming within said second bulk region a lightly doped source/drain region of said first conductivity type;
    d) forming within said first bulk region a first conductivity type lightly doped portion of a second low breakdown voltage device;
    e) forming within said first bulk region a second conductivity type portion of said second low breakdown voltage device;
    f) forming within said first bulk region a source/drain region of said second conductivity type;
    g) forming within said second bulk region a second region of said first low breakdown voltage device, of said second conductivity type;
    h) forming within said first bulk region a second region of said second low breakdown voltage device, of said first conductivity type;
    i) forming within said second bulk region a source/drain region of said first conductivity type; and
    j) forming within said second bulk region a first conductivity type portion of said first low breakdown voltage device,
    wherein said first bulk region comprises a lightly doped source/drain MOS device and a diode having said second conductivity type region of said first low breakdown voltage device, formed within said first bulk region serving as a first terminal of said first low breakdown voltage device, and said first conductivity type region within said first bulk region serves as a second terminal of said diode, and
    wherein said second bulk region comprises a lightly doped source/drain MOS device and a diode having said first conductivity type region of said second low breakdown voltage device, within said second bulk region serving as a first terminal of said diode and said second conductivity type region within said second bulk region serves as a second terminal of said diode.

20. A method as in claim 19 wherein said step of forming said first conductivity type portion within said second bulk region and said second conductivity type lightly doped portion of said first low breakdown voltage device are performed to form said portions as part of an MOS transistor having an inherent parasitic bipolar transistor forming said first low breakdown voltage device.

21. A method as in claim 20 wherein a first of said first conductivity type portions of said first low breakdown voltage device comprises an emitter, a second of said first conductivity type portion of said first low breakdown voltage device comprises a collector, and said second region of said first low breakdown voltage device comprises a base.

22. A method as in claim 19 wherein said second conductivity lightly doped portion of said first low breakdown voltage device is formed to a shallower junction depth than said first conductivity type portion of said first low breakdown voltage device.

23. A method as in claim 19 wherein said second conductivity lightly doped portion of said first low breakdown voltage device is formed to a deeper junction depth than said first conductivity type portion of said first low breakdown voltage device.

24. A method as in claim 19 wherein said step of forming said second conductivity type portion of said second low breakdown voltage device within said first bulk region and said first conductivity type lightly doped portion of said second low breakdown voltage device are performed to form said portions as part of an MOS transistor having an inherent parasitic bipolar transistor forming said second low breakdown voltage device.

25. A method as in claim 24 wherein a first of said second conductivity type portions of said second low breakdown voltage device comprises an emitter, a second of said second conductivity type portion of said second low breakdown voltage device comprises a collector, and said second region of said second low breakdown voltage device comprises a base.

26. A method as in claim 19, wherein steps a and b are performed simultaneously.

27. A method as in claim 26, wherein steps a and b are performed simultaneously using a blanket implant.

28. A method as in claim 19, wherein steps c and d are performed simultaneously.

29. A method as in claim 19, wherein steps e, f, and g are performed simultaneously.

30. A method as in claim 19, wherein steps h, i, and j are performed simultaneously.

31. A method as in claim 19, wherein at least one of said steps of forming within said bulk region said lightly doped source/drain regions of said first and second bulk regions utilizes gate electrodes as a portion of a mask and wherein said steps of forming within said first and second bulk regions said source/drain regions utilize gate electrode sidewall spacers as a portion of a mask, thereby providing said source/drain regions laterally spaced apart from said gate electrode by a lightly doped source/drain region.

32. A method as in claim 19 wherein at least one of said steps of forming within said first and second bulk regions said lightly doped portions of said first and second low breakdown voltage devices utilizes gate electrodes as a portion of a mask.

33. A method as in claim 32 wherein at least one of said steps of forming within said first and second bulk regions said first conductivity type portion of said first low breakdown voltage device and said second conductivity type portion of said second low breakdown voltage device utilizes gate electrode sidewall spacers as a portion of a mask.

34. A method as in claim 27, wherein the areas implanted by said blanket implant are over compensated in subsequent doping steps of opposite conductivity type.

35. A method as in claim 19 wherein said step of forming said second conductivity type portion of said second low breakdown voltage device comprises the step of forming said second conductivity type portion of said second low breakdown voltage device to a shallower junction depth and approximately the same lateral extent as said first conductivity type lightly doped portion of said second low breakdown voltage device.

36. A method as in claim 19 wherein said step of forming said first conductivity type portion of said first low breakdown voltage device comprises the step of forming said first conductivity type portion of said first low breakdown voltage device to a shallower junction depth and approximately the same lateral extent as said second conductivity type lightly doped portion of said first low breakdown voltage device.

37. A method as in claim 35 which further comprises the step of forming within said first bulk region a first conductivity type region overlapping said first conductivity type lightly doped portion of said second low breakdown voltage device and said first bulk region.

38. A method as in claim 35 which further comprises the step of forming within said second bulk region a second conductivity type region overlapping said second conductivity type lightly doped portion of said first low breakdown voltage device and said first bulk region.

* * * * *